United States Patent
Uenishi et al.

(10) Patent No.: US 6,489,080 B2
(45) Date of Patent: Dec. 3, 2002

(54) POSITIVE RESIST COMPOSITION

(75) Inventors: Kazuya Uenishi, Shizuoka (JP); Toru Fujimori, Shizuoka (JP); Kunihiko Kodama, Shizuoka (JP); Koji Shirakawa, Shizuoka (JP); Shiro Tan, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/449,899

(22) Filed: Dec. 2, 1999

(65) Prior Publication Data

US 2002/0015916 A1 Feb. 7, 2002

(30) Foreign Application Priority Data

| Dec. 3, 1998 | (JP) | ............................................ 10-344383 |
| Jul. 2, 1999 | (JP) | ............................................ 11-189272 |
| Nov. 26, 1999 | (JP) | ............................................ 11-336369 |

(51) Int. Cl.[7] ............................................... G03F 7/027
(52) U.S. Cl. ................................. 430/281.1; 430/270.1; 430/288.1; 430/914
(58) Field of Search ........................... 430/288.1, 281.1, 430/914

(56) References Cited

U.S. PATENT DOCUMENTS

| 5,336,745 | A | * | 8/1994 | Cheradame et al. | ...... 526/347.1 |
| 5,364,738 | A | * | 11/1994 | Kondo et al. | ................ 430/283 |
| 5,514,728 | A | * | 5/1996 | Lamanna et al. | .............. 522/31 |
| 5,824,824 | A | * | 10/1998 | Osawa et al. | .................. 568/49 |
| 5,876,900 | A | * | 3/1999 | Watanabe et al. | ........ 430/288.1 |

FOREIGN PATENT DOCUMENTS

| EP | 927726 | * | 7/1999 |

* cited by examiner

Primary Examiner—Rosemary Ashton
(74) Attorney, Agent, or Firm—Sughrue Mion, PLLC

(57) ABSTRACT

The present invention provides a positive electron beam or X-ray resist composition containing (a) a compound which generates an acid by the irradiation with radiation and (b) a compound having a cationic polymerizable function. The positive electron beam or X-ray resist composition is high sensitivity, has high resolution, can provide an excellent rectangular pattern profile, and is excellent in PCD stability and PED stability.

12 Claims, No Drawings

POSITIVE RESIST COMPOSITION

FIELD OF THE INVENTION

The present invention relates to a positive electron beam or X-ray resist composition. More particularly, the present invention relates to a positive electron beam or X-ray resist composition which is excellent in pattern profile obtained by the exposure with electron beams or X-ray, high sensitivity, excellent in resolution, and is excellent in PCD stability and PED stability with the lapse of time. PCD (Post Coating Delay) stability used herein means the film stability in the case when the resist composition is coated on a silicone wafer and allowed to stand in an electron beam irradiation apparatus under high vacuum condition, and PED (Post Exposure Delay) stability means the film stability in the case when the resist composition is allowed to stand in an electron beam irradiation apparatus under high vacuum condition during the period after electron beam irradiation and before heating process.

BACKGROUND OF THE INVENTION

Since resists of an i-line resist, a KrF excimer laser resist, an ArF excimer laser resist, etc., have the absorption in the exposure wavelength, the exposure amount at the bottom becomes less than the amount at the exposed surface, and a positive resist generally takes the shape of a pattern profile which is called a taper configuration.

However, in the case of an electron beam resist, the incident electron has electric charge and therefore interacts with the atomic nucleus and the electron of the substances constituting the resist. For this reason, scattering of an electron is bound to occur during the incidence of an electron beam to a resist film (scattering of an electron is described in Thompson, Willson and Bowden, *Introduction to Microlithography*, ACS Symposium Series 219, pp. 47 to 63). As a result, the exposure amount at the bottom of the exposed area becomes larger than the amount at the surface of the resist film, and a positive resist takes the shape of a pattern profile which is called a reverse taper configuration. Even a beam diameter is diaphragmed at exposure for resolving a fine pattern, the exposed area widens due to this scattering, as a result, resolution deteriorates.

Further, there has been a problem in the case of an electron beam resist that the resist is susceptible to the basic contaminants in the air or high vacuum condition in an electron beam irradiation apparatus (film drying), as a result, the surface becomes hardly soluble, and a T-top surface is formed (the surface becomes a T-shaped canopy top) in the case of a line pattern, and in the case of a contact hole pattern the surface takes the configuration of a capping (a canopy top is formed on the surface of the contact hole). As additional problems, the film stability in an electron beam irradiation apparatus under high vacuum condition (PCD and PED) is deteriorated with the lapse of time, and the dimension of a pattern fluctuates.

SUMMARY OF THE INVENTION

The object of the present invention is to provide a positive electron beam or X-ray resist composition which is high sensitivity, has high resolution, can provide an excellent rectangular pattern profile, and is excellent in PCD stability and PED stability.

Another object of the present invention is to provide a positive electron beam or X-ray resist composition excellent in coating properties (in-plane uniformity).

The above objects of the present invention have been attained by the following.

(1) A positive electron beam or X-ray resist composition which contains (a) a compound which generates an acid by the irradiation with radiation, and (b) a compound having a cationic polymerizable function.

(2) The positive electron beam or X-ray resist composition as described in the above item (1), wherein (b) the compound having a cationic polymerizable function is at least a compound selected from the group consisting of a vinyl compound, a cycloalkane compound, a cyclic ether compound, a lactone compound and an aldehyde compound.

(3) The positive electron beam or X-ray resist composition as described in the above item (1) or (2), wherein (b) the compound having a cationic polymerizable function is a compound represented by formula (A):

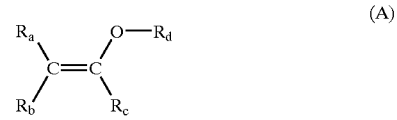

wherein $R_a$, $R_b$ and $R_c$, which may be the same or different, each represents a hydrogen atom, or an alkyl or aryl group which may have a substituent, and any two of $R_a$, $R_b$ and $R_c$ may be bonded to each other to form a saturated or olefinic unsaturated ring; and $R_d$ represents an alkyl group or a substituted alkyl group.

(4) The positive electron beam or X-ray resist composition as described in the above item (1), (2) or (3), wherein (a) the compound which generates an acid by the irradiation with radiation contains at least one compound represented by the following formula (I), (II) or (III):

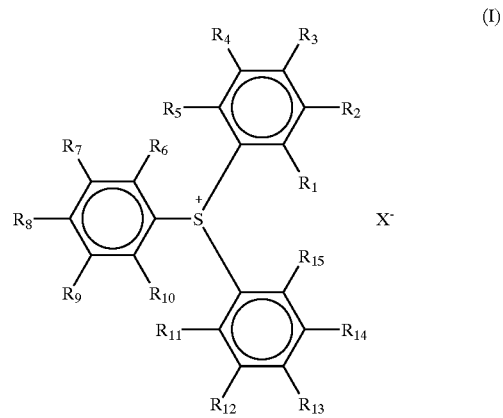

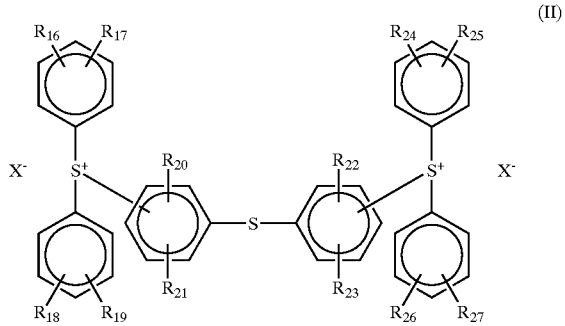

-continued

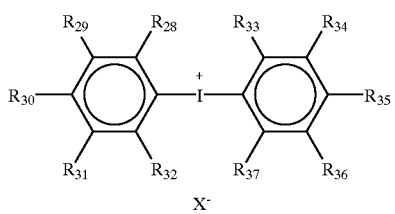

(III)

wherein $R_1$ to $R_{37}$, which may be the same or different, each represents a hydrogen atom, a straight chain, branched, or cyclic alkyl group, a straight chain, branched, or cyclic alkoxyl group, a hydroxyl group, a halogen atom, or an —S—$R_{38}$ group; $R_{38}$ represents a straight chain, branched, or cyclic alkyl group or aryl group, and two or more of $R_1$ to $R_{15}$, $R_{16}$ to $R_{27}$, and $R_{28}$ to $R_{37}$ may be bonded to form a ring containing one or two or more selected from a single bond, a carbon atom, an oxygen atom, a sulfur atom and a nitrogen atom; $X^-$ represents an anion of benzenesulfonic acid, naphthalenesulfonic acid, or anthracenesulfonic acid having at least one group selected from the group consisting of at least one fluorine atom, a straight chain, branched, or cyclic alkyl group substituted with at least one fluorine atom, a straight chain, branched, or cyclic alkoxyl group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom, and an alkoxycarbonyl group substituted with at least one fluorine atom.

(5) The positive electron beam or X-ray resist composition as described in the above item (1), (2), (3) or (4), which contains at least either one of (c) a resin having a group decomposable with an acid and being capable of increasing solubility in an alkali developing solution by the action of an acid, or (d) a low molecular weight dissolution inhibitive compound having a molecular weight of 3,000 or less which has a group decomposable with an acid and is capable of increasing solubility in an alkali developing solution by the action of an acid.

(6) The positive electron beam or X-ray resist composition as described in the above item (1), (2) or (3), wherein (a) the compound which generates an acid by the irradiation with radiation contains at least one compound represented by formula (I), (II) or (III) described in the above item (4), and the positive electron beam or X-ray resist composition contains at least either one of (c) a resin having a group decomposable with an acid and being capable of increasing the solubility in an alkali developing solution by the action of an acid, or (d) a low molecular weight dissolution inhibitive compound having a molecular weight of 3,000 or less which has a group decomposable with an acid and is capable of increasing the solubility in an alkali developing solution by the action of an acid.

DETAILED DESCRIPTION OF THE INVENTION

As described above, in an electron beam resist composition, the incidence of an electron beam to a chemically amplified resist film causes scattering of an electron. The exposed area at the bottom becomes larger than the exposed area at the resist film surface due to the scattering of an electron (front scattering and rear scattering). As a result, the resist has a reverse taper configuration or deteriorated resolution. In a chemically amplified resist, an acid is generated at the exposed part, and image formation is performed by the reaction using the generated acid as a catalyst.

As a result of eager investigations for resolving the above problems concerning an electron beam resist, the present inventors have found that these problems can be resolved by a positive resist composition containing a compound having a cationic polymerizable function (hereinafter sometimes referred to as "a cationic polymerizable compound"), particularly preferably a compound represented by formula (A), and further have found that such a composition is useful as an X-ray resist composition.

Image-forming methods comprising an enol ether compound, a linear polymer molecule having an acidic group and a hydroxyl group, and a photo-acid generator (disclosed in JP-A-5-100428 (the term "JP-A" as used herein means an "unexamined published Japanese patent application"), JP-A-5-100429, JP-A-6-148889, JP-A-6-230574, JP-A-7-140662, JP-A-7-140670, JP-A-7-146552, and JP-A-7-146557), and a composition containing an enol ether compound, a compound having an acidic group, a low molecular weight compound having a molecular weight of 3,000 or less which has an acid decomposable group, and a photo-acid generator (disclosed in JP-A-7-217593) have been conventionally known.

A compound having an acidic group is requisite for these methods for forming a film having a crosslinking structure by reacting with an enol ether compound, hence they are completely different techniques from the present invention.

The present invention does not necessitate an acidic group and is characterized in that a cationic polymerizable compound is contained. The above prior techniques contain no mention of electron beam or X-ray irradiation at all. In contrast to this, the present invention is a technique of aiming at electron beam or X-ray irradiation itself. The marvel is that the inclusion of a cationic polymerizable compound can resolve the above problems characteristic of, particularly, an electron beam resist, which has not been known at all until now.

It is thought that as a compound having a cationic polymerizable function in a positive electron beam resist composition is highly reactive with the generated acid, the compound probably has a function of capturing the unfavorable acid generated in the exposed area widened due to scattering of electron, and a function of controlling the alkali dissolution rate. Therefore, the problems of a reverse taper configuration and the deterioration of resolution can be presumably resolved at once.

In the present invention, cationic polymerization means addition polymerization in which the grown chain is a cation such as a carbonium ion and an oxonium ion. Such a cationic polymerizable monomer is called a compound having a cationic polymerizable function in the present invention. To take a vinyl compound as an example, cationic polymerization of a vinyl monomer can be discussed by the Q-e value used in radical polymerization. That is, it is well known that when the e value of a vinyl monomer becomes smaller than about −0.3, it shows cationic polymerization.

The positive electron beam or X-ray resist composition according to the present invention will be described below.

[I] Cationic Polymerizable Compound

Any compound can be used in the present invention as a cationic polymerizable compound so long as it has a cationic polymerizable function, preferably a vinyl compound, a cycloalkane compound, a cyclic ether compound, a lactone compound and an aldehyde compound can be exemplified.

Examples of vinyl compounds which can be used in the present invention include vinyl ethers described later; styrenes such as styrene, α-methylstyrene, m-methoxystyrene, p-methoxystyrene, o-chlorostyrene, m-chlorostyrene, p-chloro-styrene, o-nitrostyrene, m-nitrostyrene, p-bromostyrene, 3,4-dichlorostyrene, 2,5-dichlorostyrene, and p-dimethylamino-styrene; vinylfurans such as 2-isopropenylfuran, 2-vinyl-benzofuran, and 2-vinyldibenzofuran; vinylthiophenes such as 2-isopropenylthiophene and 2-vinylphenoxazine; N-vinyl-carbazoles; vinylnaphthalene; vinylanthracene; and acenaphthylene.

Examples of cycloalkane compounds which can be used in the present invention include phenylcyclopropane, spiro-[2,4]heptane, spiro[2,5]octane, spiro[3,4]octane, 4-methyl-spiro[2,5]octane, and spiro[2,7]decane.

Examples of cyclic ether compounds which can be used in the present invention include dioxanes such as 4-phenyl-1,3-dioxane; oxetanes such as 3,3-bischloromethyloxetane; trioxane; and 1,3-dioxepan. In addition to the above, glycidyl ethers such as allyl glycidyl ether and phenyl glycidyl ether; glycidyl esters such as glycidyl acrylate and glycidyl methacrylate; bisphenol A epoxy resin, tetrabromobisphenol A epoxy resin, bisphenol F epoxy resin, phenol novolak epoxy resin, and cresol novolak epoxy resin, which are commercially available as trade names of Epikote, can also be used.

Examples of lactone compounds which can be used in the present invention include propiolactone, butyrolactone, valerolactone, caprolactone, β-methyl-β-propiolactone, α,α-dimethyl-β-propiolactone, and α-methyl-β-propiolactone.

Examples of aldehyde compounds which can be used in the present invention include aliphatic saturated aldehyde compounds such as valeraldehyde, hexanal, heptanal, octanal, nonanal, decanal, cyclohexanecarvaldehyde, and phenylacetaldehyde; aliphatic unsaturated aldehyde compounds such as metacrolein, crotonaldehyde, 2-methyl-2-butenal, 2-butynal, and safranal; aromatic aldehyde compounds such as benzaldehyde, tolualdehyde, and cinnamaldehyde; halogen-substituted aldehyde compounds such as tribromoacetaldehyde, 2,2,3-trichlorobutylaldehyde, and chlorobenzaldehyde; hydroxy- and alkoxy-substituted aldehyde compounds such as glyceraldehyde, aldol, salicylaldehyde, m-hydroxybenzaldehyde, 2,4-dihydroxybenzaldehyde, 4-hydroxy-3-methoxybenzaldehyde, and piperonal; amino- and nitro-substituted aldehyde compounds such as aminobenzaldehyde and nitrobenzaldehyde; dialdehyde compounds such as succinaldehyde, glutaraldehyde, phthalaldehyde, and terephthalaldehyde; keto-aldehyde compounds such as phenylglyoxal and benzoylacetaldehyde and derivatives of these compounds.

A preferred cationic polymerizable compound is a vinyl compound because conspicuous effects of the present invention can be obtained, more preferred is a vinyl ether compound, and particularly preferred is a compound represented by formula (A)

In formula (A), when $R_a$, $R_b$ and $R_c$ each represents an aryl group, the aryl group generally has from 4 to 20 carbon atoms, which may be substituted with an alkyl group, an aryl group, an alkoxyl group, an aryloxy group, an acyl group, an acyloxy group, an alkylmercapto group, an aminoacyl group, a carboalkoxy group, a nitro group, a sulfonyl group, a cyano group or a halogen atom. Examples of aryl groups having from 4 to 20 carbon atoms include, e.g., a phenyl group, a tolyl group, a xylyl group, a biphenyl group, a naphthyl group, an anthryl group, and a phenanthryl group.

When $R_a$, $R_b$ and $R_c$ each represents an alkyl group, the alkyl group is a saturated or unsaturated, straight chain, branched or cyclic alkyl group having from 1 to 20 carbon atoms, which may be substituted with a halogen atom, a cyano group, an ester group, an oxy group, an alkoxyl group, an aryloxy group or an aryl group. Examples of saturated or unsaturated, straight chain, branched or cyclic alkyl groups having from 1 to 20 carbon atoms include a methyl group, an ethyl group, a propyl group, an isopropyl group, a butyl group, an isobutyl group, a t-butyl group, a pentyl group, an isopentyl group, a neopentyl group, a hexyl group, an isohexyl group, an octyl group, an isooctyl group, a nonyl group, a decyl group, a undecyl group, a dodecyl group, a tridecyl group, a tetradecyl group, a vinyl group, a propenyl group, a butenyl group, a 2-butenyl group, a 3-butenyl group, an isobutenyl group, a pentenyl group, a 2-pentenyl group, a hexenyl group, a heptenyl group, an octenyl group, a cyclopropyl group, a cyclobutyl group, a cyclopentyl group, a cyclohexyl group, a cycloheptyl group, a cyclooctyl group, a cyclopentenyl group, and a cyclohexenyl group.

Further, a saturated or olefinic unsaturated ring formed by any two of $R_a$, $R_b$ and $R_c$ by bonding to each other, specifically cycloalkane or cycloalkene, is generally a 3- to 8-membered ring, preferably a 5- or 6-membered ring.

In formula (A), preferred is an enol ether group wherein any one of $R_a$, $R_b$ and $R_c$ represents a methyl group or an ethyl group, and the remaining represent a hydrogen atom, and more preferred is the following formula (A-1) wherein $R_a$, $R_b$ and $R_c$ each represents a hydrogen atom.

$$CH_2=CH-O-R \qquad (A\text{-}1)$$

wherein R represents an alkyl group or a substituted alkyl group.

The alkyl group is a straight chain, branched or cyclic alkyl group having from 1 to 30 carbon atoms.

The substituted alkyl group is a straight chain, branched or cyclic substituted alkyl group having from 1 to 30 carbon atoms.

Examples of straight chain, branched or cyclic alkyl groups having from 1 to 30 carbon atoms include an ethyl group, a straight chain, branched or cyclic propyl group, a butyl group, a pentyl group, a hexyl group, a heptyl group, an octyl group, a nonyl group, a decyl group, a undecyl group, a dodecyl group, a tridecyl group, a tetradecyl group, a pentadecyl group, a hexadecyl group, a heptadecyl group, an octadecyl group, a nonadecyl group, and an eicosyl group.

Preferred examples of the substituents of the alkyl group include a hydroxyl group, an alkyl group, an alkoxyl group, an amino group, a nitro group, a halogen atom, a cyano group, an acyl group, an acyloxy group, a sulfonyl group, a sulfonyloxy group, a sulfonylamino group, an aryl group, an aralkyl group, an imido group, a hydroxymethyl group, $-O-R_1$, $-C(=O)-R_2$, $-O-C(=O)-R_3$, $-C(=O)-O-R_4$, $-S-R_5$, $-C(=S)-R_6$, $-O-C(=S)-R_7$, and $-C(=S)-O-R_8$, and $R_1$ to $R_8$ each represents a straight chain, branched or cyclic alkyl group, an alkoxyl group, an amino group, a nitro group, a halogen atom, a cyano group, an acyl group, a sulfonyl group, a sulfonyloxy group, a sulfonylamino group, an imido group, —(CH$_2$CH$_2$—O)—R$_9$ (wherein n represents an integer of from 1 to 20, R$_9$ represents a hydrogen atom or an alkyl group), an aryl or aralkyl group which may have a substituent (examples of the substituents include a straight chain, branched or cyclic alkyl group, an alkoxyl group, an amino group, a nitro group, a halogen atom, a cyano group, an acyl group, an aryl group and an aralkyl group).

Preferred examples of the compounds represented by formula (A) are shown below but the present invention is not limited thereto.

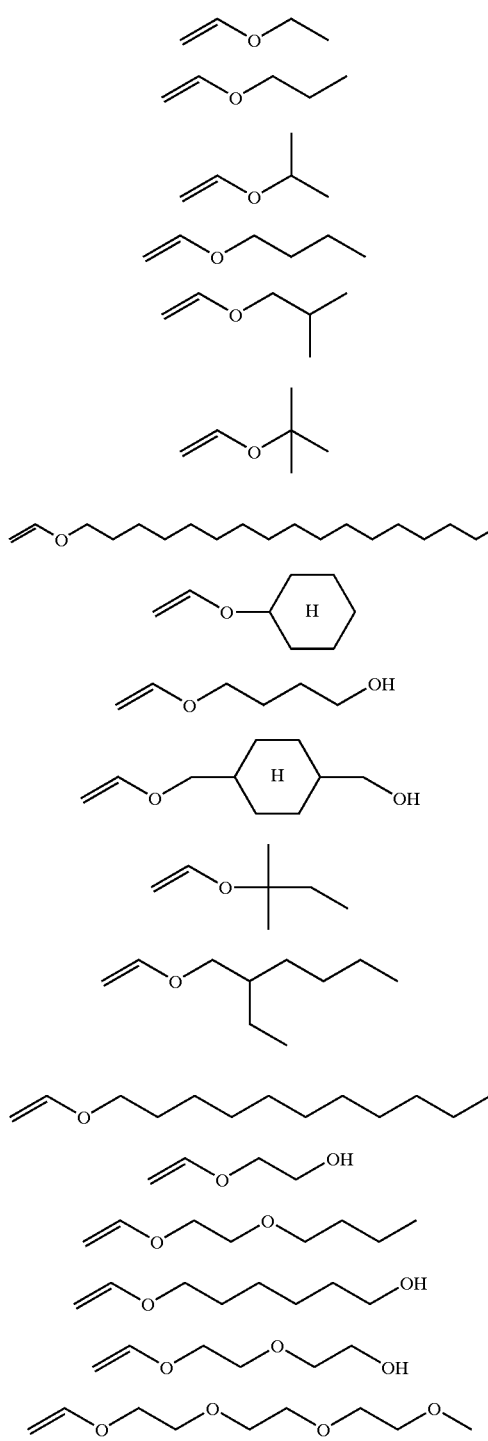

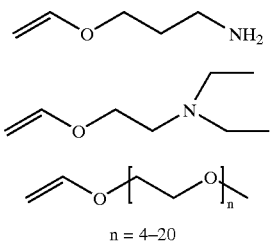

The compound represented by formula (A-1) can be synthesized according to the methods described in Stephen C. Lapin, *Polymers Paint Colour Journal*, 179 (4237), 321 (1988), that is, the compound can be obtained by the reaction of alcohols or phenols with acetylene, or by the reaction of alcohols or phenols with a halogenated alkyl vinyl ether. The compound can also be synthesized by the reaction of a carboxylic acid compound with a halogenated alkyl vinyl ether.

The content of the cationic polymerizable compound (preferably the compound represented by formula (A)) in the resist composition according to the present invention is preferably from 0.5 to 50% by weight, and more preferably from 3 to 30% by weight, based on the total weight of the composition (solid content).

[II] (a) Compound Which Generates Acid by Irradiation With Radiation (Sometimes Referred to as Component (a))

Any compound can be used in the present invention as component (a) so long as it generates an acid by irradiation with radiation, preferably a compound represented by formula (I), (II) or (III).

[II-1] Compound Represented by Formula (I), (II) or (III)

In formulae (I), (II) and (III), examples of the straight chain or branched alkyl group represented by $R_1$ to $R_{38}$ include those having from 1 to 4 carbon atoms (e.g., a methyl group, an ethyl group, a propyl group, an n-butyl group, a sec-butyl group, and a t-butyl group) which may have a substituent. Examples of the cyclic alkyl group represented by $R_1$ to $R_{38}$ include those having from 3 to 8 carbon atoms (e.g., a cyclopropyl group, a cyclopentyl group, and a cyclohexyl group) which may have a substituent.

Examples of the straight chain or branched alkoxyl group represented by $R_1$ to $R_{37}$ include those having from 1 to 4 carbon atoms (e.g., a methoxy group, an ethoxy group, a hydroxyethoxy group, a propoxy group, an n-butoxy group, an isobutoxy group, a sec-butoxy group, and a t-butoxy group) which may have a substituent.

Examples of the cyclic alkoxyl group represented by $R_1$ to $R_{37}$ include a cyclopentyloxy group and a cyclohexyloxy group.

Examples of the halogen atom represented by $R_1$ to $R_{37}$ include a fluorine atom, a chlorine atom, a bromine atom, and an iodine atom.

Example of the aryl group represented by $R_{38}$ include those having from 6 to 14 carbon atoms (e.g., a phenyl group, a tolyl group, a methoxyphenyl group, and a naphthyl group) which may have a substituent.

Examples of the substituent include an alkoxyl group having from 1 to 4 carbon atoms, a halogen atom (a fluorine atom, a chlorine atom, and an iodine atom), an aryl group having from 6 to 10 carbon atoms, an alkenyl group having from 2 to 6 carbon atoms, a cyano group, a hydroxyl group, a carboxyl group, an ankoxycarbonyl group, and a nitro group.

As a ring containing one or two or more selected from a single bond, a carbon atom, an oxygen atom, a sulfur atom and a nitrogen atom formed by bonding two or more of $R_1$ to $R_{15}$, $R_{16}$ to $R_{27}$, and $R_{28}$ to $R_{37}$, a furan ring, a dihydrofuran ring, a pyran ring, a trihydropyran ring, a thiophene ring, and a pyrrole ring can be exemplified.

In formulae (I), (II) and (III), $X^-$ represents an anion of benzenesulfonic acid, naphthalenesulfonic acid or anthracenesulfonic acid having at least one group selected from the group consisting of at least one fluorine atom, a straight chain, branched, or cyclic alkyl group substituted with at least one fluorine atom, a straight chain, branched, or cyclic alkoxyl group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom, and an alkoxycarbonyl group substituted with at least one fluorine atom.

The above straight chain, branched, or cyclic alkyl group preferably has from 1 to 12 carbon atoms and substituted with from 1 to 25 fluorine atoms. Examples thereof include a trifluoromethyl group, a pentafluoroethyl group, a 2,2,2-trifluoroethyl group, a heptafluoropropyl group, a heptafluoroisopropyl group, a perfluorobutyl group, a perfluorooctyl group, a perfluorododecyl group, and a perfluorocyclohexyl group. A perfluoroalkyl group having from 1 to 4 carbon atoms in which all the substituents are fluorine atoms is preferred above all.

The above straight chain, branched, or cyclic alkoxyl group preferably has from 1 to 12 carbon atoms and substituted with from 1 to 25 fluorine atoms. Specific examples include a trifluoromethoxy group, a pentafluoroethoxy group, a heptafluoroisopropyloxy group, a perfluorobutoxy group, a perfluorooctyloxy group, a perfluorododecyloxy group, and a perfluorocyclohexyloxy group. A perfluoroalkoxy group having from 1 to 4 carbon atoms in which all the substituents are fluorine atoms is preferred above all.

The above acyl group preferably has from 2 to 12 carbon atoms and substituted with from 1 to 23 fluorine atoms. Specific examples include a trifluoroacetyl group, a fluoroacetyl group, a pentafluoropropionyl group, and a pentafluorobenzoyl group.

The above acyloxy group preferably has from 2 to 12 carbon atoms and substituted with from 1 to 23 fluorine atoms. Specific examples include a trifluoroacetoxy group, a fluoroacetoxy group, a pentafluoropropionyloxy group, and a pentafluorobenzoyloxy group.

The above sulfonyl group preferably has from 1 to 12 carbon atoms and substituted with from 1 to 25 fluorine atoms. Specific examples include a trifluoromethanesulfonyl group, a pentafluoroethanesulfonyl group, a perfluorobutanesulfonyl group, a perfluorooctanesulfonyl group, a pentafluorobenzenesulfonyl group, and a 4-trifluoromethylbenzenesulfonyl group.

The above sulfonyloxy group preferably has from 1 to 12 carbon atoms and substituted with from 1 to 25 fluorine atoms. Specific examples include a trifluoromethanesulfonyloxy group, a perfluorobutanesulfonyloxy group, and a 4-trifluoromethylbenzenesulfonyloxy group.

The above sulfonylamino group preferably has from 1 to 12 carbon atoms and substituted with from 1 to 25 fluorine atoms. Specific examples include a trifluoromethanesulfonylamino group, a perfluorobutanesulfonylamino group, a perfluorooctanesulfonylamino group, and a pentafluorobenzenesulfonylamino group.

The above aryl group preferably has from 6 to 14 carbon atoms and substituted with from 1 to 9 fluorine atoms. Specific examples include a pentafluorophenyl group, a 4-trifluoromethylphenyl group, a heptafluoronaphthyl group, a nonafluoroanthranyl group, a 4-fluorophenyl group, and a 2,4-difluorophenyl group.

The above aralkyl group preferably has from 7 to 10 carbon atoms and substituted with from 1 to 15 fluorine atoms. Specific examples include a pentafluorophenylmethyl group, a pentafluorophenylethyl group, a perfluorobenzyl group, and a perfluorophenethyl group.

The above alkoxycarbonyl group preferably has from 2 to 13 carbon atoms and substituted with from 1 to 25 fluorine atoms. Specific examples include a trifluoromethoxycarbonyl group, a pentafluoroethoxycarbonyl group, a pentafluorophenoxycarbonyl group, a perfluorobutoxycarbonyl group, and a perfluorooctyloxycarbonyl group.

$X^-$ most preferably represents an anion of benzenesulfonic acid substituted with a fluorine atom, and particularly preferably an anion of pentafluorobenzenesulfonic acid.

The above benzenesulfonic acid, naphthalenesulfonic acid or anthracenesulfonic acid each containing a fluorine-containing substituent may further be substituted with a straight chain, branched, or cyclic alkoxyl group, an acyl group, an acyloxy group, a sulfonyl group, a sulfonyloxy group, a sulfonylamino group, an aryl group, an aralkyl group, an alkoxycarbonyl group (the ranges of carbon atoms of these groups are the same as those described above), a halogen atom (excluding a fluorine atom), a hydroxyl group, or a nitro group.

Specific examples of the compounds represented by formula (I) are described below.

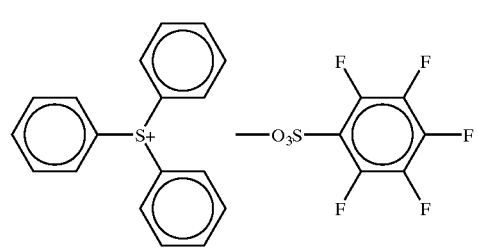
(I-1)

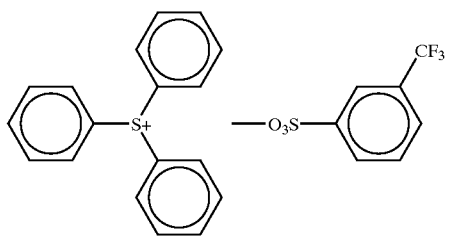
(I-2)

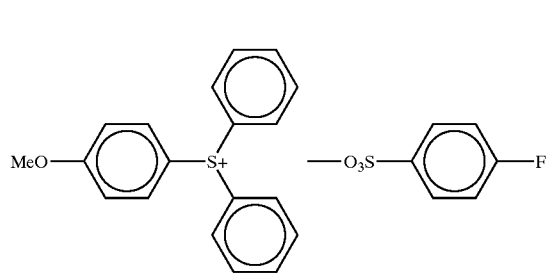
(I-3)

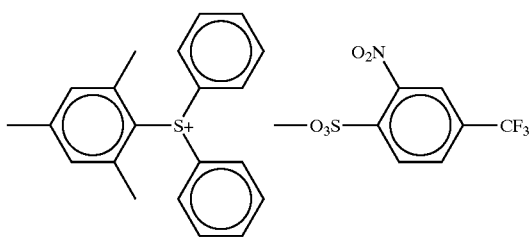
(I-4)

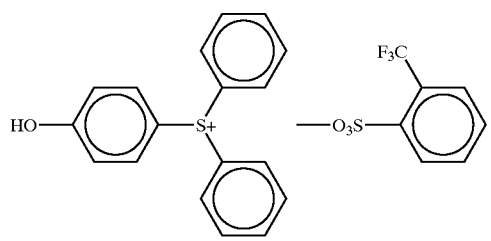
(I-5)

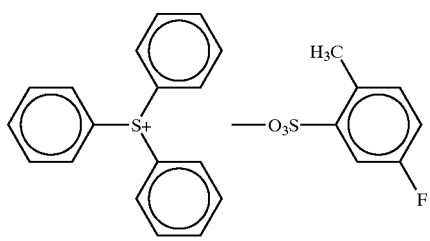
(I-6)

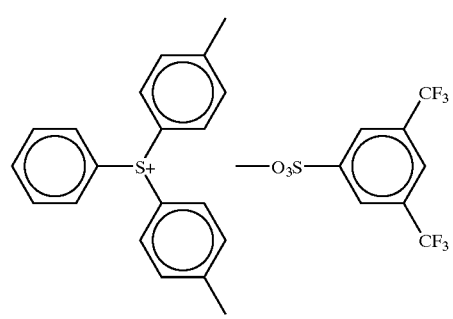
(I-7)

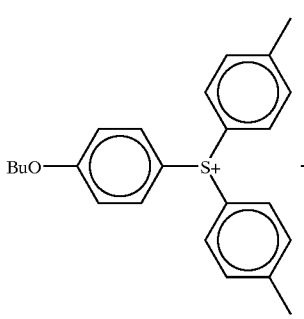
(I-8)

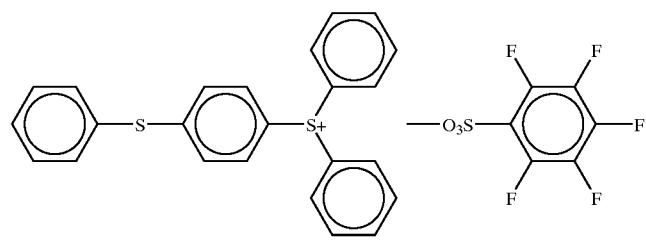
(I-9)

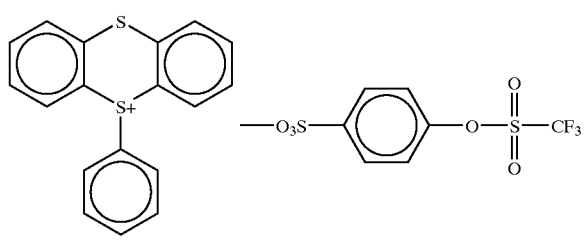
(I-10)
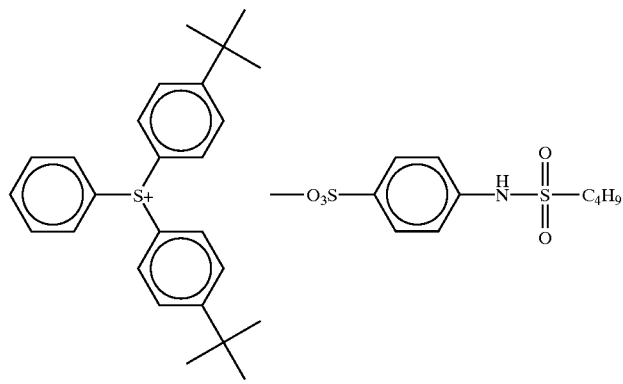
(I-11)
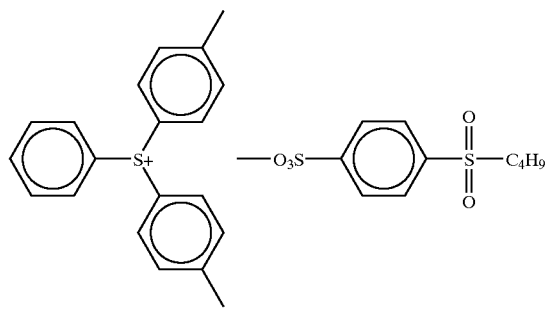
(I-12)
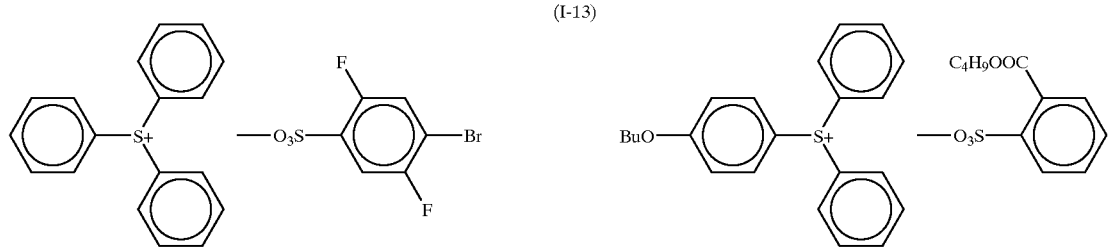
(I-13)     (I-14)
Specific examples of the compounds represented by formula (II) are described below.
-continued
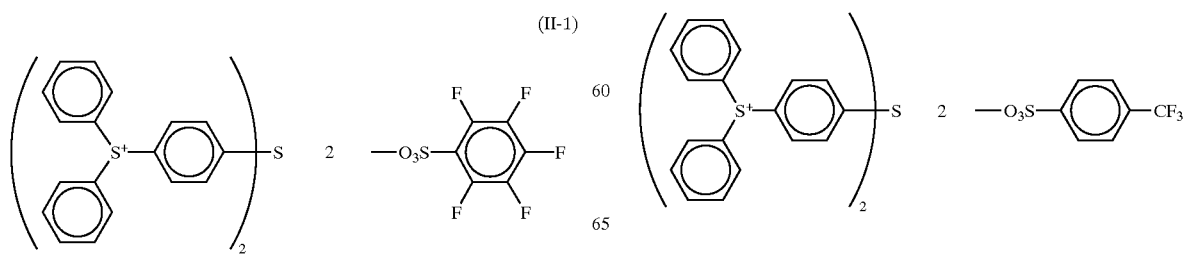
(II-1)     (II-2)

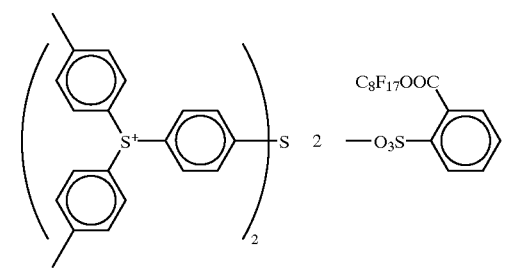
(II-3)
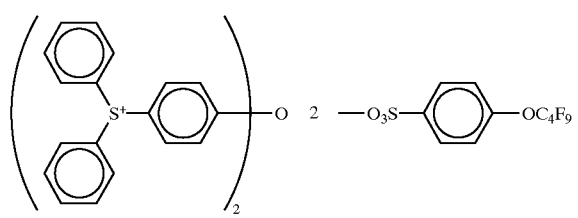
(II-4)
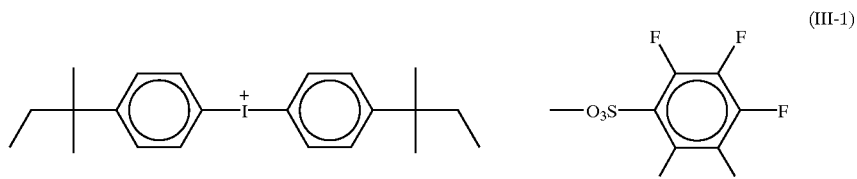
(II-5)
Specific examples of the compounds represented by formula (III) are described below.
(III-1)
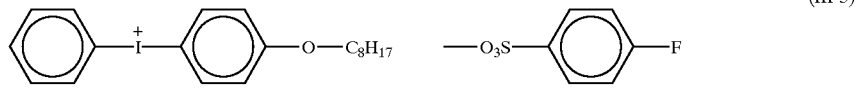
(III-2)
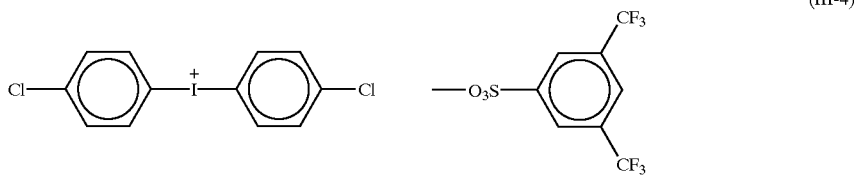
(III-3)
(III-4)
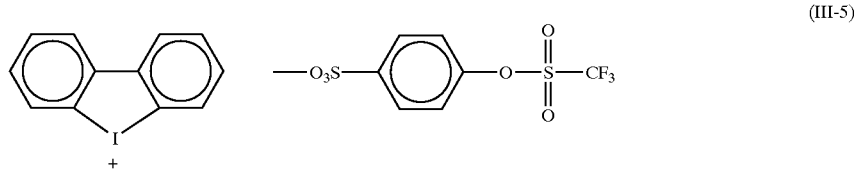
(III-5)
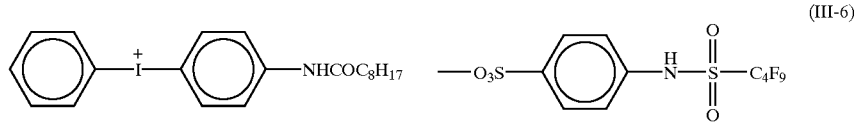
(III-6)
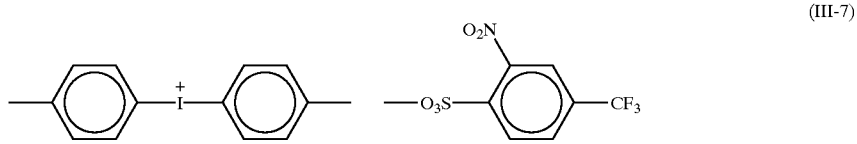
(III-7)

(III-8)

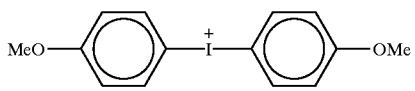 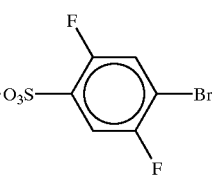

The compound represented by formula (I), (II) or (III) may be used alone or may be used in combination of two or more.

The compounds represented by formula (I) or (II) can be synthesized by a method comprising reacting an aryl Grignard reagent such as arylmagnesium bromide with a substituted or unsubstituted phenyl sulfoxide, and subjecting the obtained triarylsulfonium halide to salt exchange with corresponding sulfonic acid, a method comprising condensing a substituted or unsubstituted phenyl sulfoxide and a corresponding aromatic compound using an acid catalyst, e.g., methanesulfonic acid/diphosphorus pentoxide or aluminum chloride, and subjecting the obtained product to salt exchange, or a method comprising condensing diaryliodonium salt and diaryl sulfide using a catalyst, e.g., copper acetate, and subjecting the obtained product to salt exchange.

The compound represented by formula (III) can be synthesized by subjecting an aromatic compound to a reaction using periodate.

Sulfonic acid or sulfonate for use in salt exchange can be obtained by a method of hydrolyzing a commercially available sulfonic acid chloride, a method of reacting an aromatic compound with a chlorosulfonic acid, or a method of reacting an aromatic compound with a sulfamic acid.

Specific synthesis methods of the compounds represented by formula (I), (II) or (III) are described below.

Synthesis of Pentafluorobenzenesulfonic Acid Tetramethylammonium Salt

Pentafluorobenzenesulfonyl chloride (25 g) was dissolved in 100 ml of methanol with ice-cooling, and 100 g of a 25% aqueous solution of tetramethylammonium hydroxide was gradually added thereto. The reaction mixture was stirred at room temperature for 3 hours, thereby a solution of a pentafluorobenzenesulfonic acid tetramethylammonium salt was obtained. This solution was used for salt exchange of a sulfonium salt and an iodonium salt.

Synthesis of Triphenylsulfonium
Pentafluorobenzenesulfonate Synthesis of
Compound (I-1)

Diphenyl sulfoxide (509 g) was dissolved in 800 ml of benzene, 200 g of aluminum chloride was added thereto and refluxed for 24 hours. The reaction solution was gradually poured to 2 liters of water, 400 ml of a concentrated hydrochloric acid was added thereto and the mixed solution was heated at 70° C. for 10 minutes. This aqueous solution was washed with 500 ml of ethyl acetate, filtered, and then 400 ml of water having dissolved therein 200 g of ammonium iodide was added thereto.

The precipitated powders were filtered out, washed with water and then with ethyl acetate, and dried, thereby 70 g of a triphenylsulfonium iodide was obtained.

Triphenylsulfonium iodide (30.5 g) was dissolved in 1,000 ml of methanol, 19.1 g of silver oxide was added to the solution and stirred at room temperature for 4 hours. The solution was filtered, and the excess amount of a solution of the above-synthesized tetramethylammonium salt of pentafluorobenzenesulfonic acid was added to the filtrate. The reaction solution was concentrated, dissolved in 500 ml of dichloromethane, and this solution was washed with a 5% aqueous tetramethylammonium hydroxide solution and then with water. The organic phase was dried over anhydrous sodium sulfate and concentrated, thereby triphenylsulfonium pentafluorobenzenesulfonate was obtained.

Synthesis of Triarylsulfonium
Pentafluorobenzenesulfonate Synthesis of Mixture
of Compounds (I-9) and (II-1)

Fifty grams of triarylsulfonium chloride (manufactured by Fluka Co., a 50% aqueous triphenylsulfonium chloride solution) was dissolved in 500 ml of water, to this solution was added the excess amount of a solution of tetramethylammonium salt of pentafluorobenzenesulfonic acid. As a result, an oily product was precipitated. The supernatant was removed by decantation, and the obtained oily product was washed with water and dried, thereby triarylsulfonium pentafluorobenzenesulfonate (containing Compounds (I-9) and (II-1) as main components) was obtained.

Synthesis of Di(4-t-amylphenyl)iodonium
Pentafluorobenzenesulfonate (Compound (III-1))

Sixty grams of t-Amylbenzene, 39.5 g of potassium iodate, 81 g of acetic anhydride, and 170 ml of dichloromethane were mixed, and 66.8 g of concentrated sulfuric acid was gradually dropwise added to the mixture with ice-cooling. After stirring the mixture with ice-cooling for 2 hours, the stirring was continued for 10 hours at room temperature. Water (500 ml) was added to the reaction solution with ice-cooling followed by extraction with dichloromethane. The organic phase was washed with sodium hydrogencarbonate and then with water, then concentrated, thereby di(4-t-amylphenyl)iodonium sulfate was obtained. This sulfate was added to an excess amount of pentafluorobenzenesulfonic acid tetramethylammonium salt. Water (500 ml) was added to this solution followed by extraction with dichloromethane. The organic phase was washed with a 5% aqueous tetramethylammonium hydroxide solution and then with water, then concentrated, thereby di(4-t-amylphenyl)iodonium pentafluorobenzenesulfonate was obtained.

Other compounds can also be synthesized according to similar manner.

[II-2] Other Photo-acid Generators Which can be Used as Component (a)

The following compounds capable of decomposing upon irradiation of radiation and generate an acid can be used as component (a) in the present invention.

Moreover, in the present invention, the following compounds capable of being decomposed with irradiation of radiation and generate an acid can be used as component (a) together with the compound represented by formula (I), (II) or (III).

The content of the photo-acid generator which can be used together with the compound represented by formula (I), (II) or (III) in the present invention is generally from 100/0 to 20/80, preferably from 100/0 to 40/60, and still more preferably from 100/0 to 50/50, in molar ratio of component (a)/other acid generator.

The total content of component (a) is generally from 0.1 to 20% by weight, preferably from 0.5 to 10% by weight, and still more preferably from 1 to 7% by weight, based on the solid content of the entire composition of the positive electron beam or X-ray resist composition according to the present invention.

As such a photo-acid generator, a photocationic polymerization photoinitiator, a photoradical polymerization photoinitiator, a photodecoloring agent of dyes, a photodiscoloring agent, well-known compounds used in a microresist which generate acids by electron beam irradiation and mixtures of these can be arbitrarily selected.

The following compounds can be used in the present invention, for example, diazonium salts described in S. I. Schlesinger, *Photogr. Sci. Eng.*, 18, 387 (1974), and T. S. Bal et al., *Polymer*, 21, 423 (1980); ammonium salts described in U.S. Pat. Nos. 4,069,055, 4,069,056, Re 27,992, and Japanese Patent Application No. 3-140140; phosphonium salts described in D. C. Necker et al., *Macromolecules*, 17, 2468 (1984), C. S. Wen et al., *The, Proc. Conf. Rad. Curing ASIA*, p. 478, Tokyo, October (1988), U.S. Pat. Nos. 4,069,055 and 4,069,056; iodonium salts described in J. V. Crivello et al., *Macromolecules*, 10 (6), 1307 (1977), *Chem. Eng. News*, Nov. 28 p. 31, (1988), EP No. 104143, U.S. Pat. Nos. 339,049, 410,201, JP-A-2-150848, and JP-A-2-296514; sulfonium salts described in J. V. Crivello et al., *Polymer*, J. 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J. Polymer Sci.*, Polymer Chem. Ed., 17, 2877 (1977), EP Nos. 370693, 3902114, 233567, 297443, 297442, U.S. Pat. Nos. 4,933, 377, 161,811, 410,201, 339,049, 4,760,013, 4,734,444, 2,833,827, German Patents 2,904,626, 3,604,580 and 3,604, 581; selenonium salts described in J. V. Crivello et al., *Macromolecules*, 10 (6), 1307 (1977), and J. V. Crivello et al., *J. Polymer Sci.*, Polymer Chem. Ed., 17, 1047 (1979); onium salts, such as arsonium salts, etc., described in C. S. Wen et al., *The, Proc. Conf. Rad. Curing ASIA*, p. 478, Tokyo, October (1988); organic halogen compounds described in U.S. Pat. No. 3,905,815, JP-β-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metals/organic halogen compounds described in K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; photo-acid generators having an o-nitrobenzyl protective group described in S. Hayase et al., *J. Polymer Sci.*, 25, 753 (1987), E. Reichmanis et al., *J. Polymer Sci.*, Polymer Chem- Ed., 23, 1 (1985), Q. Q. Zhu et al., *J. Photochem.*, 36, 85, 39, 317 (1987), B. Amit et al., *Tetrahedron Lett.*, (24)2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130 (6), F. M. Houlihan et al., *Macromolecules*, 21, 2001 (1988), EP Nos. 0290750, 046083, 156535, 271851, 0388343, U.S. Pat. Nos. 3,901,710, 4,181,531, JP-A-60-198538, and JP-A-53-133022; compounds which generate a sulfonic acid by photodecomposition represented by iminosulfonate described in N. Tunooka et al., *Polymer Preprints, Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), EP Nos. 0199672, 84515, 199672, 044115, 0101122, U.S. Pat. Nos. 618,564, 4,371,605, 4,431,774, JP-A-64-18143, JP-A-2-245756, and Japanese Patent Application No. 3-140109; and disulfone compounds described in JP-A-61-166544.

Further, compounds having introduced these groups or compounds generating an acid by electron beam irradiation into the polymer main chain or side chain can be used in the present invention, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Further, the compounds which generate an acid by light as described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and EP No. 126712 can be used in the present invention.

Of the above compounds which are decomposed by irradiation of radiation and generate an acid and can be used in combination with component (a), those particularly effectively used in the present invention are described below.

(1) An oxazole derivative represented by formula (PAG1) or an S-triazine derivative represented by formula (PAG2) substituted with a trihalomethyl group

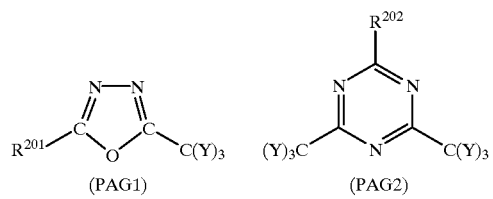

(PAG1)　　　　(PAG2)

wherein $R^{201}$ represents a substituted or unsubstituted aryl group or alkenyl group; $R^{202}$ represents a substituted or unsubstituted aryl group, alkenyl group, alkyl group, or —C(Y)$_3$; and Y represents a chlorine atom or a bromine atom.

Specific examples are shown below but the present invention is not limited thereto.

(PAG1-1)

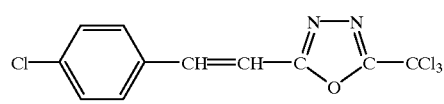

(PAG1-2)
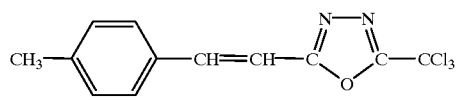
(PAG1-3)
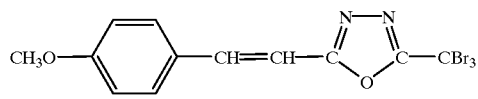
(PAG1-4)
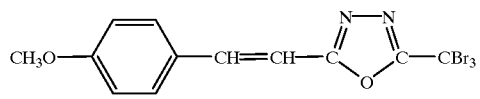
(PAG1-5)
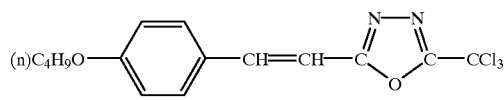
(PAG1-6)
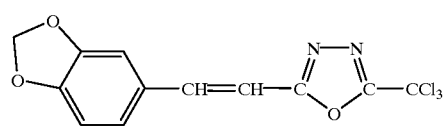
(PAG1-7)
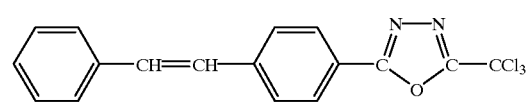
(PAG1-8)
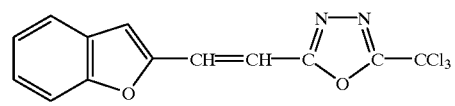
(PAG2-1)
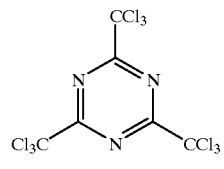
(PAG2-2)
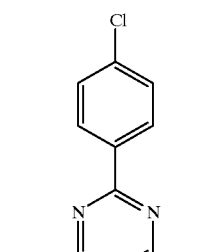
(PAG2-3)
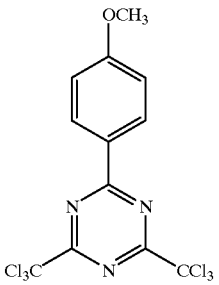
(PAG2-4)
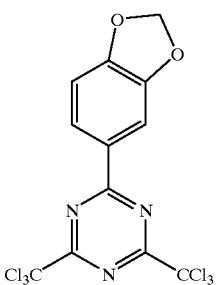
(PAG2-5)
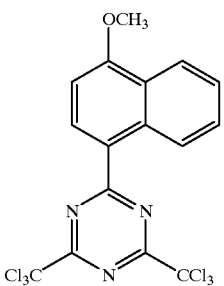
(PAG2-6)
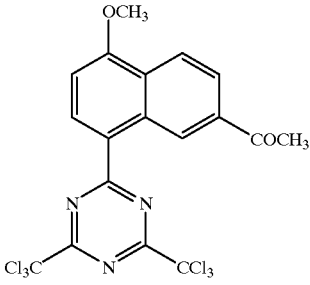
(PAG2-7)
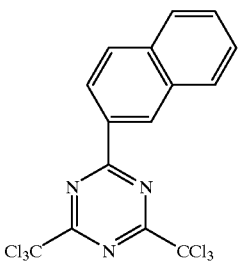

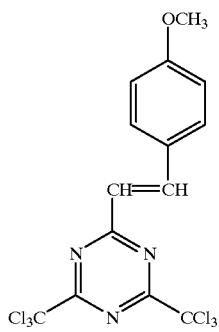
(PAG2-8)

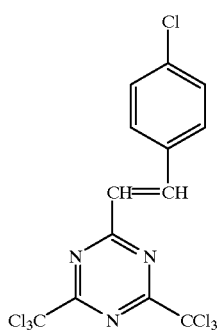
(PAG2-9)

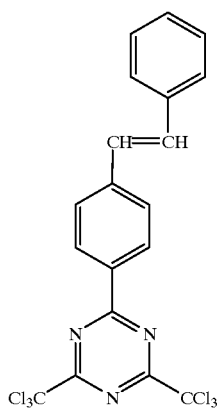
(PAG2-10)

(2) An iodoniumn salt represented by formula (PAG3) or a sulfonium salt represented by formula (PAG4)

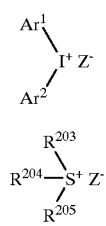
(PAG3)

(PAG4)

wherein $Ar^1$ and $Ar^2$ each represents a substituted or unsubstituted aryl group. Examples of preferred substituents include an alkyl group, a haloalkyl group, a cycloalkyl group, an aryl group, an alkoxyl group, a nitro group, a carboxyl group, an alkoxycarbonyl group, a hydroxyl group, a mercapto group, and a halogen atom.

$R^{203}$, $R^{204}$, $R^{205}$ each represents a substituted or unsubstituted alkyl group or aryl group, preferably an aryl group having from 6 to 14 carbon atoms, an alkyl group having from 1 to 8 carbon atoms, or substituted derivatives thereof. Examples of preferred substituents for the aryl group include an alkoxyl group having from 1 to 8 carbon atoms, an alkyl group having from 1 to 8 carbon atoms, a nitro group, a carboxyl group, a hydroxyl group and a halogen atom, and examples of preferred substituents for the alkyl group include an alkoxyl group having from 1 to 8 carbon atoms, a carboxyl group, and an alkoxycarbonyl group.

$Z^-$ represents a counter anion, e.g., $BF_4^-$, $AsF_6^-$, $PF_6^-$, $SbF_6^-$, $SiF_6^{2-}$, $ClO_4^-$, an anion of perfluoroalkanesulfonic acid such as $CF_3SO_3^-$, an anion of pentafluorobenzenesulfonic acid, an anion of a condensed polynuclear aromatic sulfonic acid such as a naphthalene-1-sulfonic acid anion, an anthraquinonesulfonic acid anion, or a sulfonic acid-containing dye, but the present invention is not limited thereto.

Further, two of $R^{203}$, $R^{204}$ and $R^{205}$, and $Ar^1$ and $Ar^2$ may be bonded through respective single bonds or substituents.

Specific examples thereof are shown below but the present invention is not limited thereto.

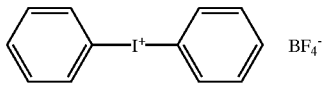
(PAG3-1)

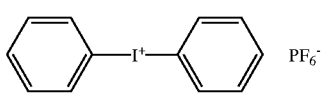
(PAG3-2)

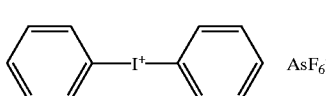
(PAG3-3)

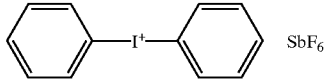
(PAG3-4)

(PAG3-5)

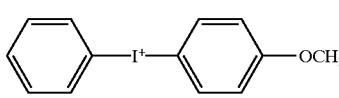
(PAG3-6)

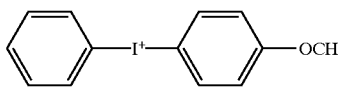
(PAG3-7)

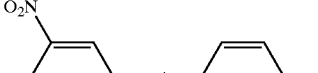
(PAG3-8)

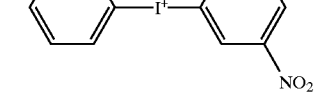

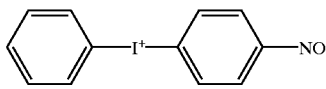
(PAG3-9)

-continued
(PAG3-10)
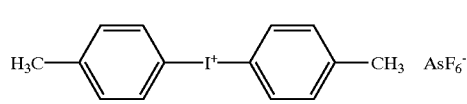 AsF$_6^-$
(PAG3-11)
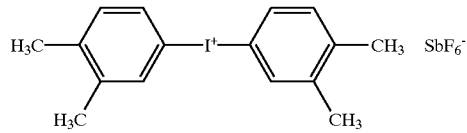 SbF$_6^-$
(PAG3-12)
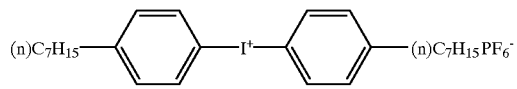 PF$_6^-$
(PAG3-13)
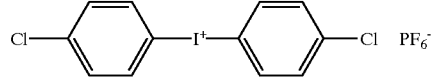 PF$_6^-$
(PAG3-14)
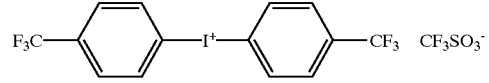 CF$_3$SO$_3^-$
(PAG3-15)
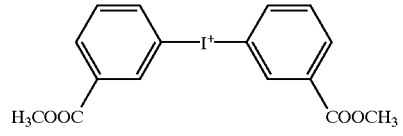 PF$_6^-$
(PAG3-16)
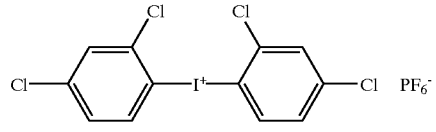 PF$_6^-$
(PAG3-17)
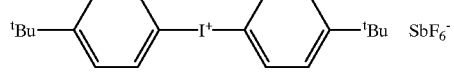 SbF$_6^-$
(PAG3-18)
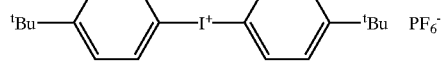 PF$_6^-$
(PAG3-19)
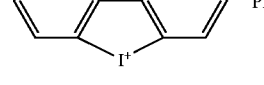 PF$_6^-$
(PAG3-20)
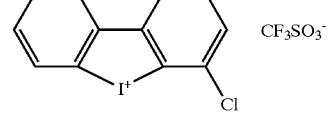 CF$_3$SO$_3^-$
-continued
(PAG3-21)
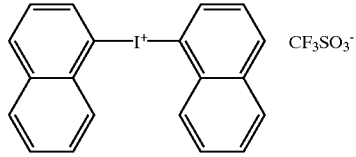 CF$_3$SO$_3^-$
(PAG3-22)
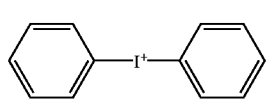
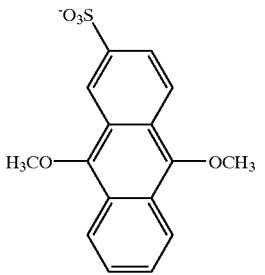
(PAG3-23)
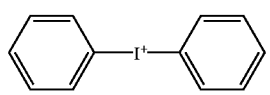
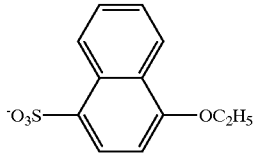
(PAG3-24)
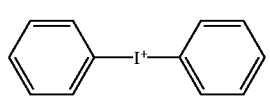
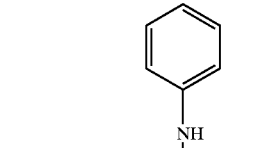
(PAG3-25)
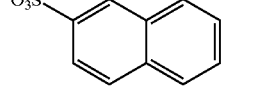
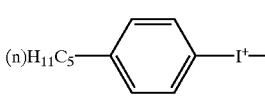
(PAG3-26)
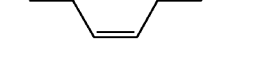

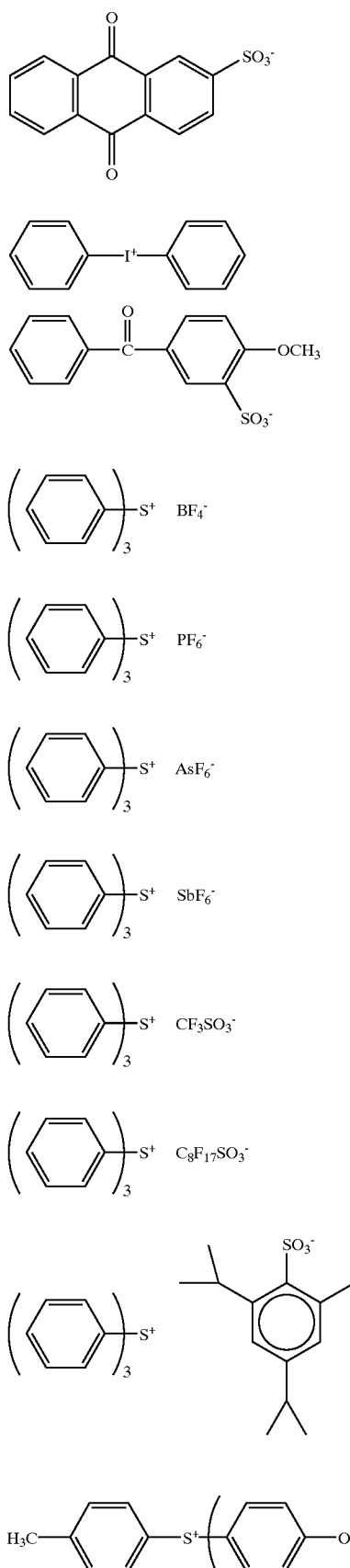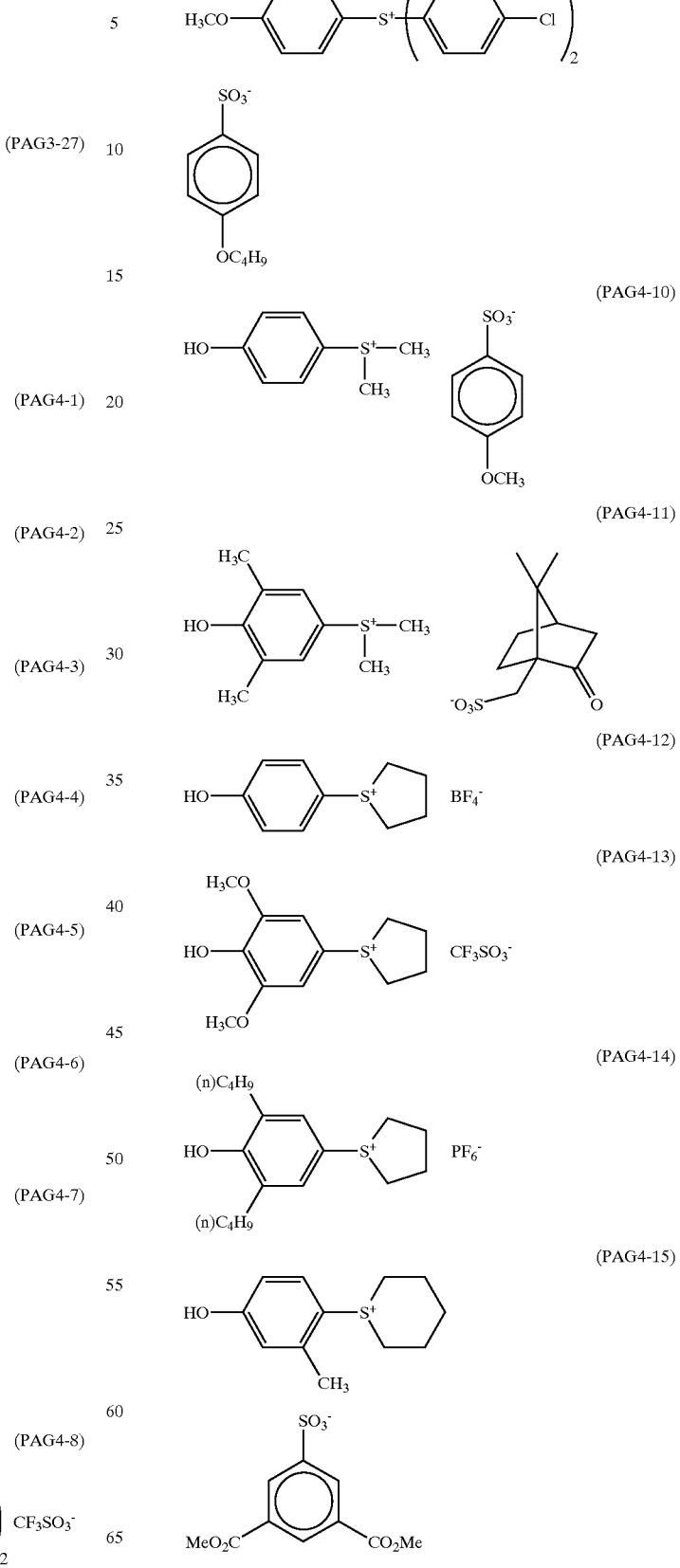

(PAG4-16)
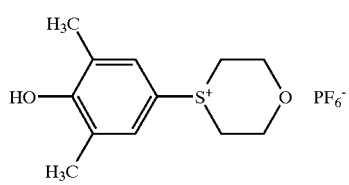
(PAG4-17)
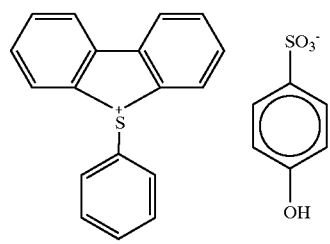
(PAG4-18)
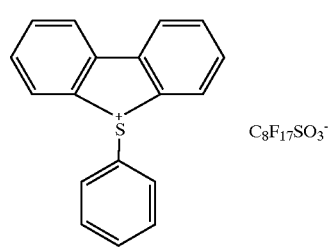
(PAG4-19)
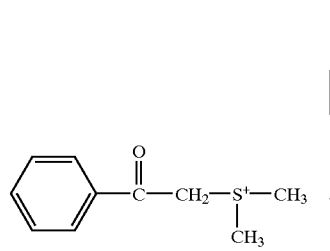
(PAG4-20)
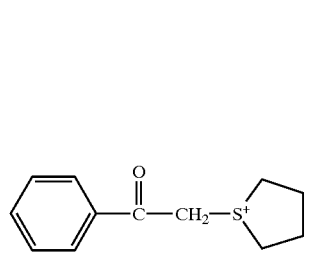
(PAG4-21)
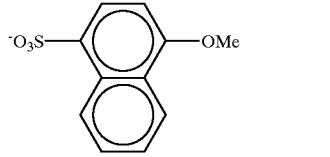
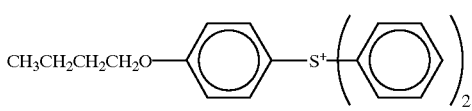

-continued

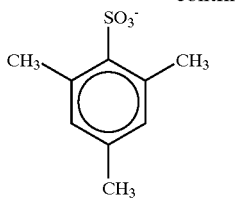
(PAG4-30)

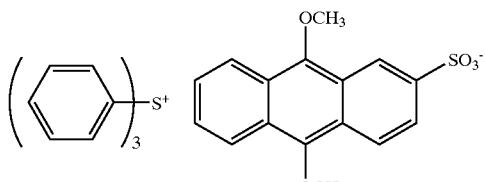
(PAG4-31)

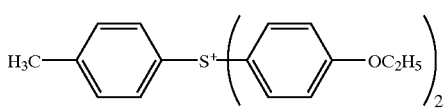
(PAG4-32)

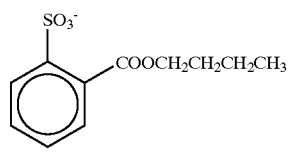
(PAG4-33)

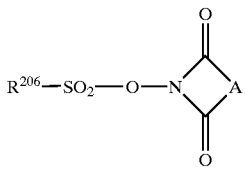
(PAG4-34)

The above-described onium salts represented by formulae (PAG3) and (PAG4) are well-known compounds and can be synthesized according to the methods described, e.g., in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belga.*, 73, 546 (1964), H. M. Leicester, *J. Ame. Chem. Soc.*, 51, 3587 (1929), J. V. Crivello et al., *J. Polymer Sci.*, Polymer Chem. Ed., 18, 2677 (1980), U.S. Pat. Nos. 2,807,648, 4,247,473, and JP-A-53-101331.

(3) A disulfone derivative represented by formula (PAG5) or an iminosulfonate derivative represented by formula (PAG6)

$$Ar^3-SO_2-SO_2-Ar^4 \quad (PAG5)$$

(PAG6)

wherein $Ar^3$ and $Ar^4$ each represents a substituted or unsubstituted aryl group; $R^{206}$ represents a substituted or unsubstituted alkyl group or aryl group; and A represents a substituted or unsubstituted alkylene group, alkenylene group, or arylene group.

Specific examples thereof are shown below but the present invention is not limited thereto.

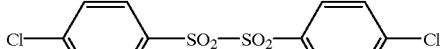
(PAG5-1)

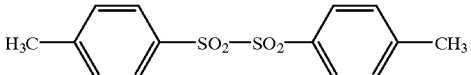
(PAG5-2)

(PAG5-3)

(PAG5-4)

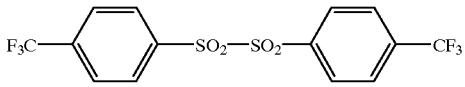
(PAG5-5)

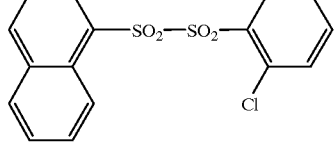
(PAG5-6)

(PAG5-7)
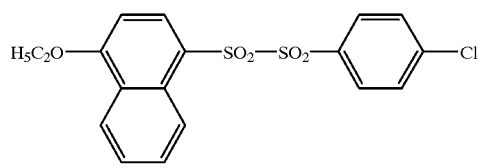
(PAG5-8)
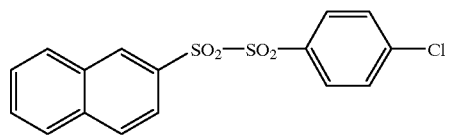
(PAG5-9)
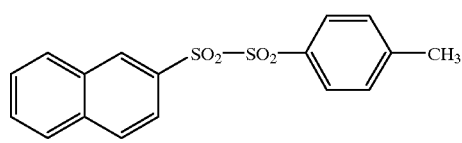
(PAG5-10)
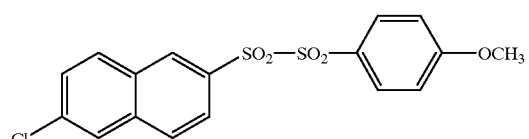
(PAG5-11)
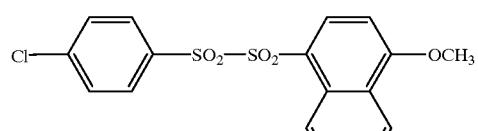
(PAG5-12)
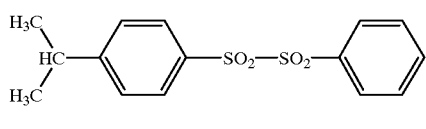
(PAG5-13)
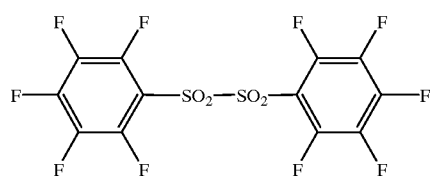
(PAG5-14)
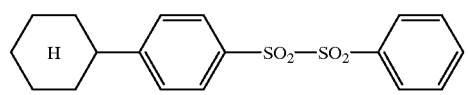
(PAG6-1)
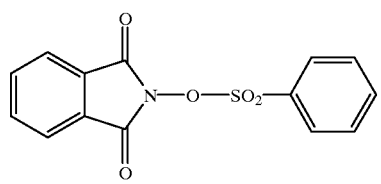
(PAG6-2)
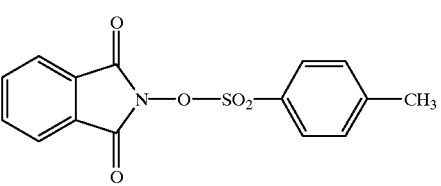
(PAG6-3)
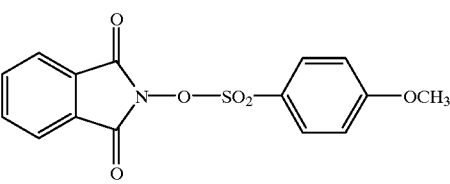
(PAG6-4)
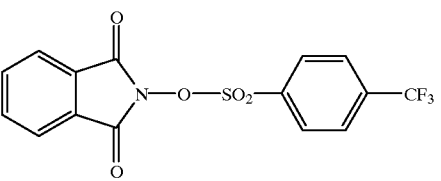
(PAG6-5)
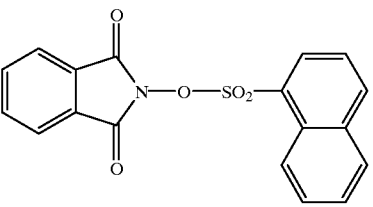
(PAG6-6)
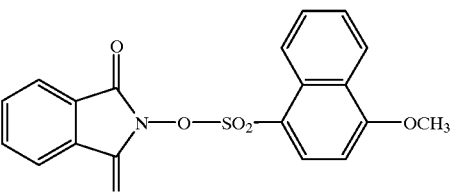
(PAG6-7)
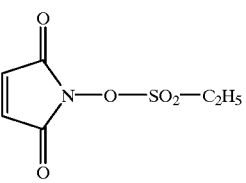
(PAG6-8)
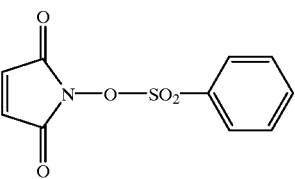

-continued

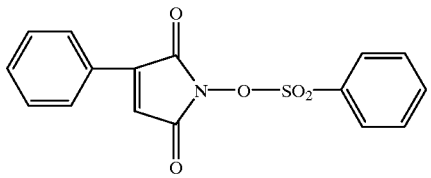
(PAG6-9)

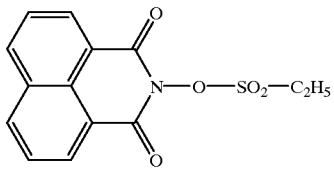
(PAG6-10)

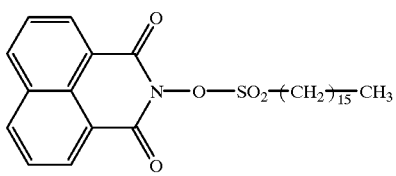
(PAG6-11)

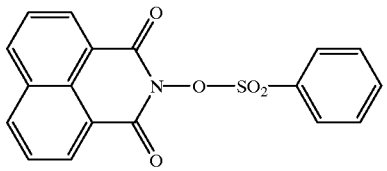
(PAG6-12)

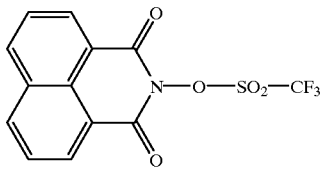
(PAG6-13)

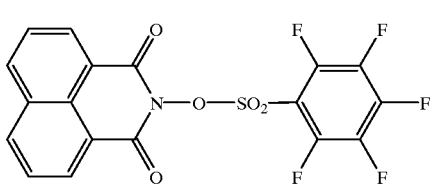
(PAG6-14)

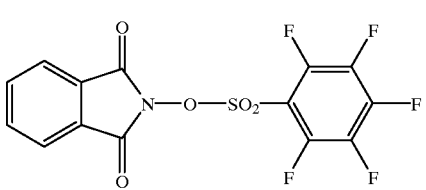
(PAG6-15)

In the present invention, it is preferred to contain at least either one of (c) a resin having a group decomposable with an acid and being capable of increasing the solubility in an alkali developing solution by the action of an acid (hereinafter sometimes referred to as component (c)), or (d) a low molecular weight dissolution inhibitive compound having a molecular weight of 3,000 or less which has a group decomposable with an acid and is capable of increasing the solubility in an alkali developing solution by the action of an acid (hereinafter sometimes referred to as component (d)).

[III] (c) Resin Having a Group Decomposable with an Acid and Being Capable of Increasing the Solubility in an Alkali Developing Solution by the Action of an Acid Component (c) for use in a positive electron beam or X-ray resist composition according to the present invention is a resin having introduced a group decomposable with an acid into the polymer main chain or side chain, or both the polymer main chain and side chain. A resin having a group decomposable with an acid at the side chain is more preferred.

Preferred groups decomposable with an acid are a —COO—$A^0$ group and an —O—$B^0$ group. Further, an —$R^0$—COO—$A^0$ group and an —Ar—O—$B^0$ group can be exemplified as groups containing these groups.

Here, $A^0$ represents a —$C(R^{01})(R^{02})(R^{03})$ group, an —$Si(R^{01})(R^{02})(R^{03})$ group, or —$C(R^{04})(R^{05})$—O—$R^{06}$ group; $B^0$ represents $A^0$ or a —CO—O—$A^0$ group ($R^0$, $R^{01}$, $R^{02}$, $R^{03}$, $R^{40}$, $R^{05}$, $R^{06}$, and Ar are the same as those described later).

Examples of preferred acid-decomposable groups include a silyl ether group, a cumyl ester group, an acetal group, a tetrahydropyranyl ether group, an enol ether group, an enol ester group, a tertiary alkyl ether group, a tertiary alkyl ester group, a tertiary alkylcarbonate group and the like. More preferred examples include a tertiary alkyl ester group, a tertiary alkylcarbonate group, a cumyl ester group, an acetal group, and a tetrahydropyranyl ether group.

A parent resin in the case when the acid-decomposable groups are bonded as a side chain is an alkali-soluble resin having an —OH group or a —COOH group, preferably an —$R^0$—COOH group or an —Ar—OH group, at the side chain. The alkali-soluble resins described below can be exemplified as such parent resins, for instance.

Alkali-dissolution rate of these alkali-soluble resins is preferably 170 Å/sec or more, and particularly preferably 330 Å/sec or more when measured with 0.261 N tetramethylammonium hydroxide (TMAH) at 23° C.

In the light of these points, particularly preferred alkali-soluble resins are o-, m-, p-poly(hydroxystyrene), and copolymers of these, hydrogenated poly (hydroxystyrene), halogen- or alkyl-substituted poly(hydroxystyrene), partially O-alkylated or O-acylated products of poly (hydroxystyrene), styrene-hydroxystyrene copolymers, α-methylstyrene-hydroxystyrene copolymers, and hydrogenated novolak resins.

Component (c) for use in the present invention can be obtained, as disclosed in EP 254853, JP-A-2-25850, JP-A-3-223860 and JP-A-4-251259, by reacting an alkali-soluble resin with the precursor of a group decomposable with an acid, or by copolymerizing the alkali-soluble resin monomer, to which an acid-decomposable group is bonded, with various monomers.

Specific examples of component (c) for use in the present invention are shown below, but it should not be construed as the present invention is limited thereto.

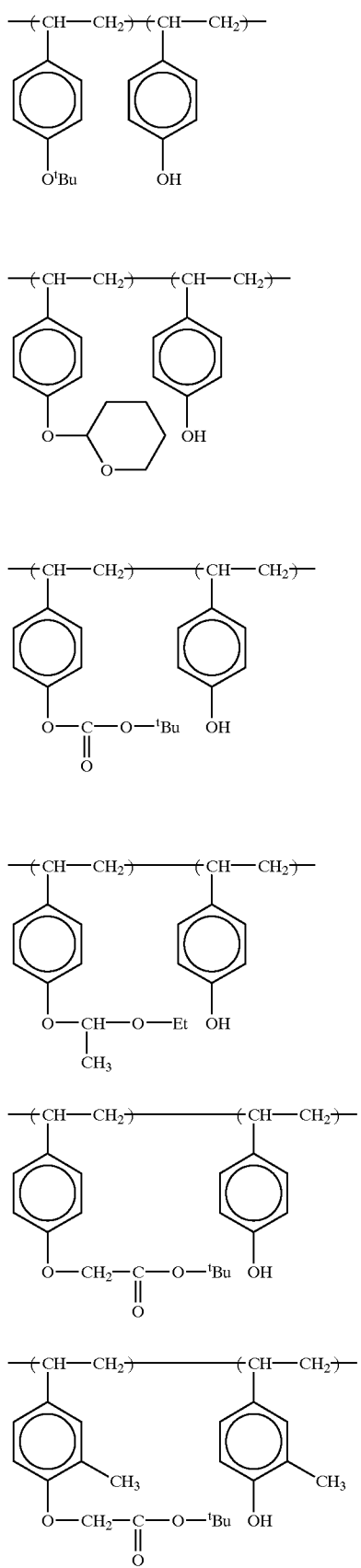
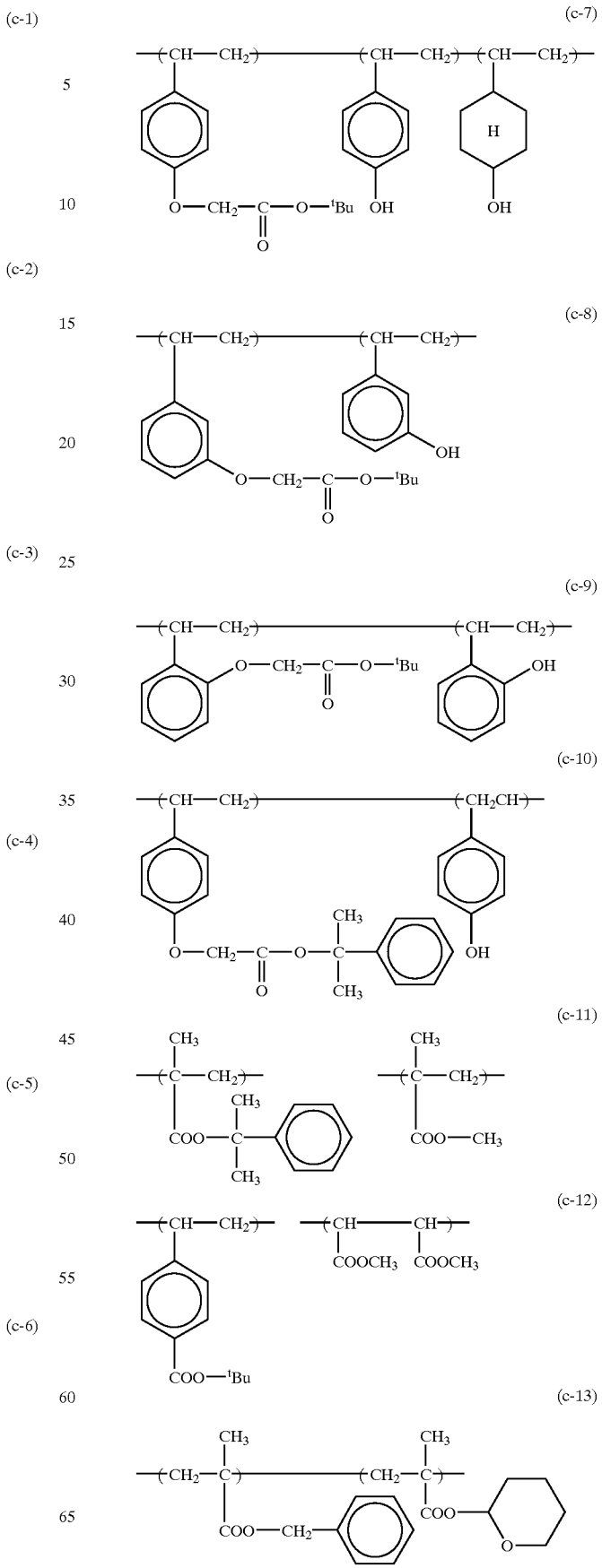

(c-14) 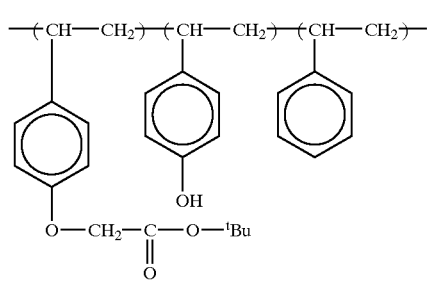
(c-15) 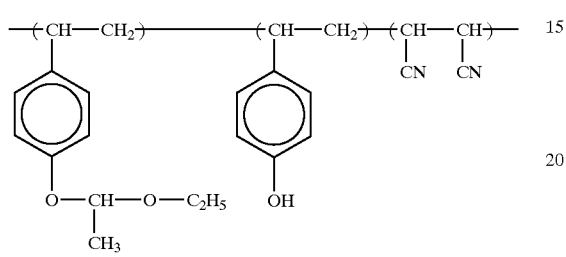
(c-16) 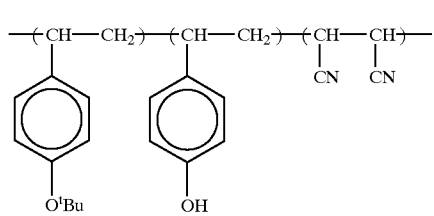
(c-17) 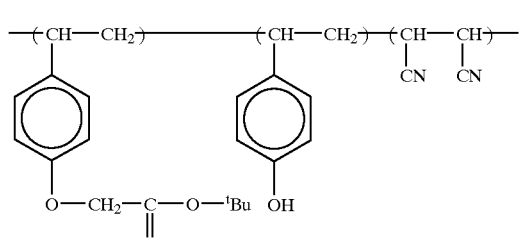
(c-18) 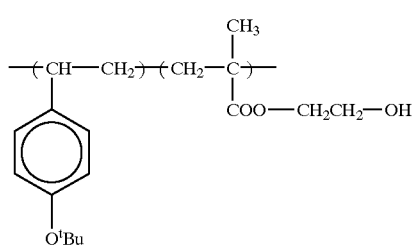
(c-19) 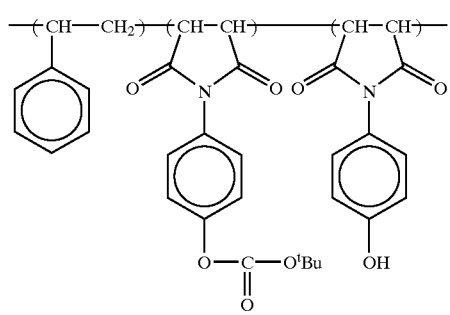
(c-20) 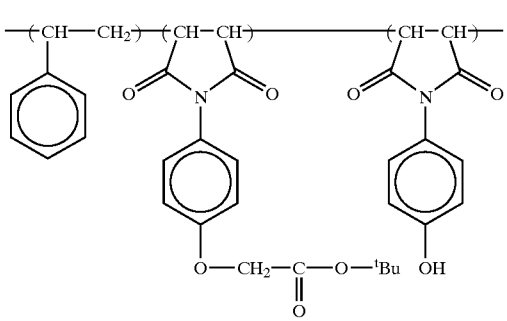
(c-21) 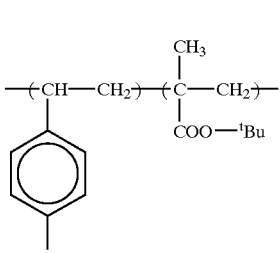
(c-22) 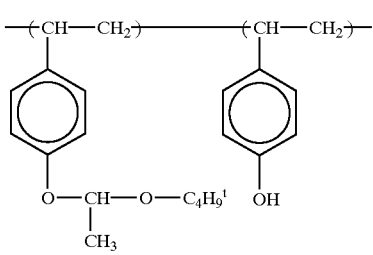
(c-23) 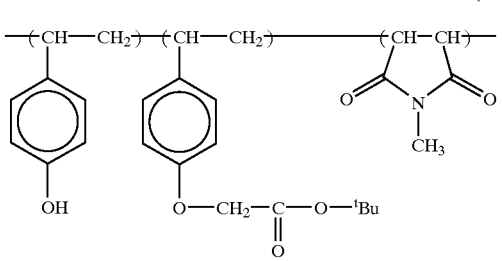
(c-24) 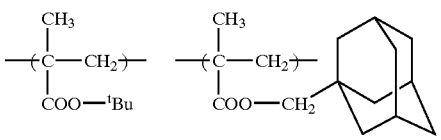
(c-25) 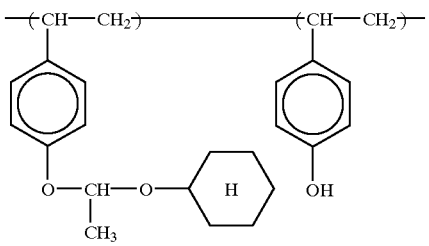

(c-26) 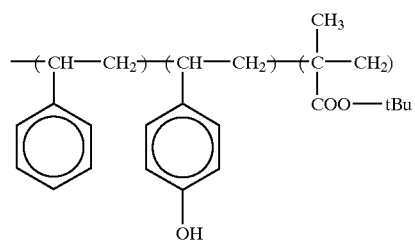
(c-27) 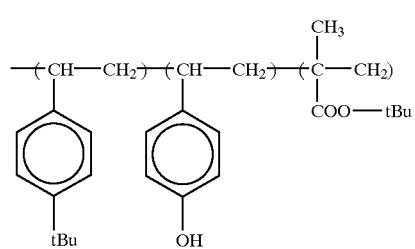
(c-28) 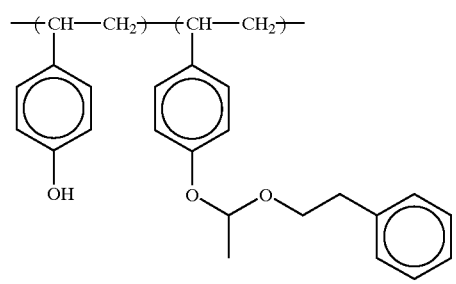
(c-29) 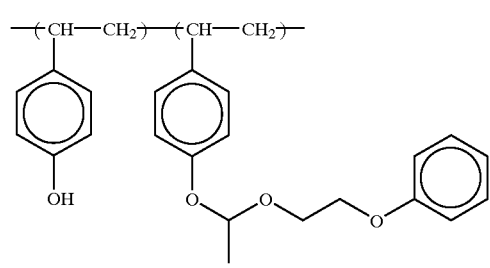
(c-30) 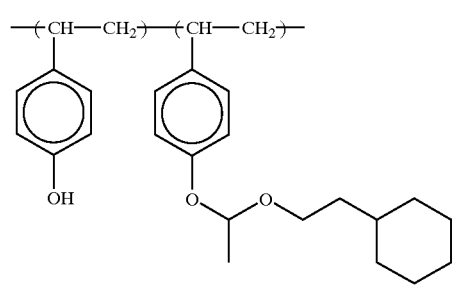
(c-31) 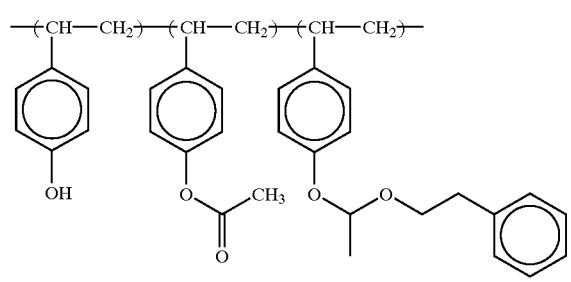
(c-32) 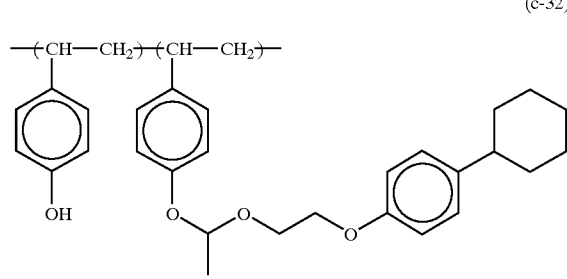
(c-33) 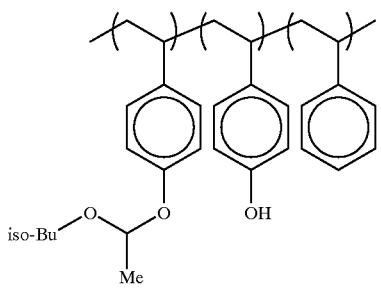
(c-34) 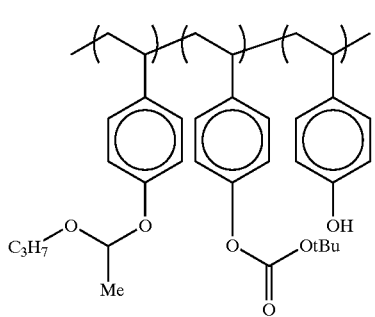
(c-35) 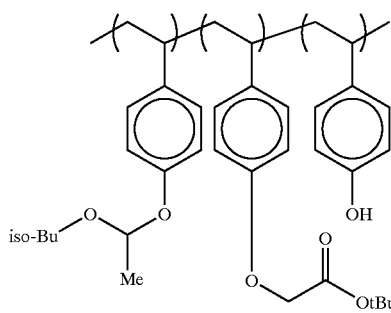

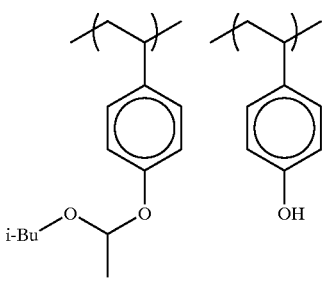
(c-36)

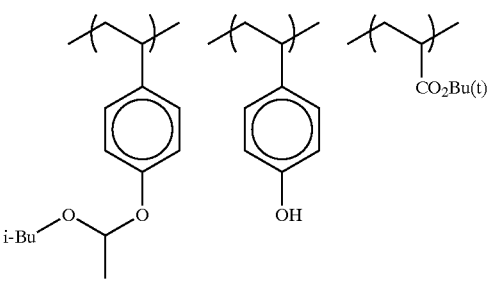
(c-37)

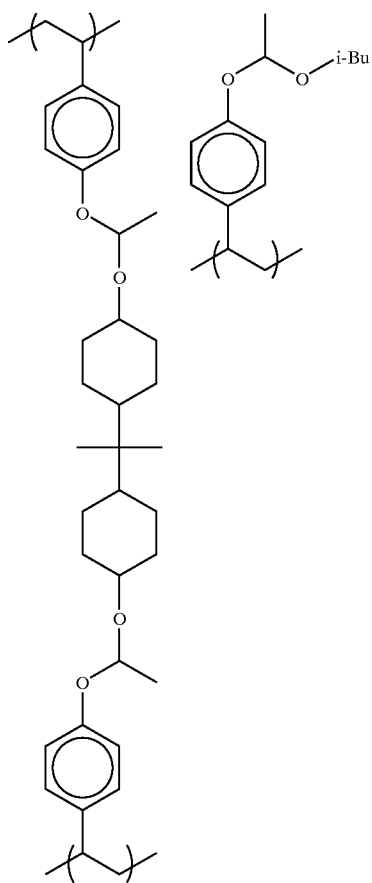

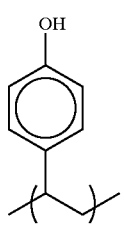

The content ratio of groups decomposable with an acid is expressed by B/(B+S) taking the number of groups decomposable with the acid in the resin as (B), and the number of alkali-soluble groups which are not protected with groups decomposable with the acid as (S). The content ratio is preferably from 0.01 to 0.7, more preferably from 0.05 to 0.50, and still more preferably from 0.05 to 0.40. If B/(B+S)>0.7, film shrinkage after PEB, adhesion failure of the film to the substrate and generation of scum disadvantageously occur. While when B/(B+S)<0.01, sometimes considerable standing waves remain on a pattern wall, which is also not advantageous.

The weight average molecular weight (Mw) of component (c) is preferably within the range of from 2,000 to 200,000. If the weight average molecular weight is less than 2,000, the layer thickness in the unexposed area extremely decreases and, on the contrary, when it exceeds 200,000, the solution rate in alkali of the alkali-soluble resin itself reduces and the sensitivity lowers. A more preferred weight average molecular weight is from 5,000 to 100,000, and still more preferably from 8,000 to 50,000.

The molecular weight distribution (Mw/Mn) is preferably from 1.0 to 4.0, more preferably from 1.0 to 2.0, and particularly preferably from 1.0 to 1.6. The smaller the degree of distribution, the higher are the heat resistance and image-forming properties (pattern profiling, defocus latitude).

The weight average molecular weight used herein is defined as a polystyrene calculated value in gel permeation chromatography.

Component (c) can be used in combination of two or more.

[IV] Low Molecular Dissolution Inhibitive Compound (Component (d))

The photosensitive composition of the present invention may comprise a low molecular acid-decomposable dissolution inhibitive compound (d) (hereinafter occasionally referred to as "component (d)") incorporated therein. The component (d) is a low molecular compound with a molecular weight of not more than 3,000 containing an acid-decomposable group which increases its solubility in an alkaline developer when acted on by an acid.

The component (d), i.e., acid-decomposable dissolution inhibitive compound is preferably a compound containing at least two acid-decomposable groups in its structure wherein at least 8 connecting atoms other than acid-decomposable group are interposed between the acid-decomposable groups which are separated from each other at the greatest distance.

Preferred examples of the foregoing acid-decomposable dissolution inhibitive compound include (a) a compound containing at least two acid-decomposable groups in its structure wherein at least 10, preferably at least 11, more preferably at least 12 connecting atoms other than acid-decomposable group are interposed between the acid-decomposable groups which are separated from each other at the greatest distance, and (b) a compound containing at least three acid-decomposable groups in its structure wherein at least 9, preferably at least 10, more preferably at least 11 connecting atoms other than acid-decomposable group are interposed between the acid-decomposable groups which are separated from each other at the greatest distance.

The upper limit of the number of the foregoing connecting atoms is preferably 50, more preferably 30.

If the acid-decomposable dissolution inhibitive compound contains three or more, preferably four or more acid-decomposable groups, even two acid-decomposable groups, its capacity of inhibiting dissolution in an alkali-soluble resin is remarkably enhanced as far as these acid-decomposable groups are separated from each other at a predetermined or greater distance.

The distance between the acid-decomposable groups is represented by the number of connecting atoms interposed therebetween excluding the acid-decomposable groups. In the case of the following compounds (1) and (2) for example, the distance between the acid-decomposable groups is four connecting atoms. In the case of the following compound (3), the distance between the acid-decomposable groups is 12 connecting atoms.

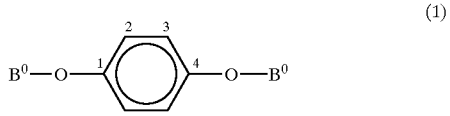
(1)

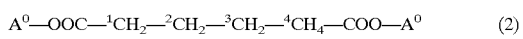
(2)

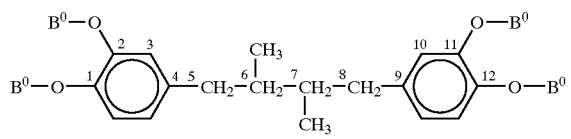
(3)

Acid-decomposable group: —COO—A$_0$, —O—B$^0$

Further, the acid-decomposable dissolution inhibitive compound may have a plurality of acid-decomposable groups on one benzene ring. Preferably, it is a compound formed by a skeleton having one acid-decomposable group on one benzene ring. The molecular weight of component (d) is generally 3,000 or less, preferably from 300 to 3,000, more preferably from 500 to 2,500.

An example of the acid-decomposable group, i.e., group containing —COO—A$^0$ group or —O—B$^0$ group is preferably a group represented by the general formula —R$^0$—COO—A$^0$ or —Ar—O—B$^0$.

A$^0$ represents —C(R$^{01}$)(R$^{02}$)(R$^{03}$), —Si(R$^{01}$)(R$^{02}$)(R$^{03}$) or —C(R$^{04}$)(R$^{05}$)—O—R$^{06}$ group. B$^0$ represents A$^0$ or —CO—O—A$^0$ group.

R$^{01}$, R$^{02}$, R$^{03}$, R$^{04}$ and R$^{05}$ may be the same or different and each represent a hydrogen atom, alkyl group, cycloalkyl group, alkenyl group or aryl group, and R$^{06}$ represents an alkyl or aryl group, with the proviso that at least two of R$^{01}$ to R$^{03}$ are groups other than hydrogen atom and two of R$^{01}$ to R$^{03}$ and R$^{04}$ to R$^{06}$ may be connected to each other to form a ring. R$^0$ represents a divalent or higher aliphatic or aromatic hydrocarbon group which may contain substituents. —Ar— represents a divalent or higher aromatic group which may contain monocyclic or polycyclic substituents. The alkyl group represented by R$^{01}$, R$^{02}$, R$^{03}$, R$^{04}$ or R$^{05}$ is preferably a C$_{1-4}$ alkyl group such as methyl, ethyl, propyl, n-butyl, sec-butyl and t-butyl. The cycloalkyl group represented by R$^{01}$, R$^{02}$, R$^{03}$, R$^{04}$ or R$^{05}$ is preferably a C$_{3-10}$ cycloalkyl group such as cyclopropyl, cyclobutyl, cyclohexyl and adamantyl. The alkenyl group represented by R$^{01}$, R$^{02}$, R$^{03}$, R$^{04}$ or R$^{05}$ is preferably a C$_{2-4}$ alkenyl group such as vinyl, propenyl, allyl and butenyl. The aryl group represented by R$^{01}$, R$^{02}$, R$^{03}$, R$^{04}$ or R$^{05}$ is preferably a C$_{6-14}$ aryl group such as phenyl, xylyl, toluyl, cumenyl, naphthyl and anthracenyl.

Examples of substituents on these groups include a hydrogen atom, a halogen atom (fluorine, chlorine, bromine, iodine), nitro group, cyano group, the foregoing alkyl group, alkoxy group such as methoxy, ethoxy, hydroxyethoxy, propoxy, hydroxypropoxy, n-butoxy, isobutoxy, sec-butoxy and t-butoxy, alkoxycarbonyl group such as methoxycarbonyl and ethoxycarbonyl, aralkyl group such as benzyl, phenethyl and cumyl, aralkyloxy group, acyl group such as formyl, acetyl, butyryl, benzoyl, cyanamyl and valeryl, acyloxy group such as butyryloxy, the foregoing alkenyl group, alkenyloxy group such as vinyloxy, propenyloxy, allyloxy and butenyloxy, the foregoing aryl group, aryloxy group such as phenoxy, and aryloxycarbonyl group such as benzoyloxy.

Preferred examples of the acid-decomposable group include silylether group, cumylester group, acetal group, tetrahydropyranylether group, enolether group, enol ester group, tertiary alkyl ether group, tertiary alkyl ester group, and tertiary alkylcarbonate group. Preferred among these acid-decomposable groups are tertiary alkyl ester group, tertiary alkylcarbonate group, cumylester group, and tetrahydropyranylether group.

The component (d) includes a compound protected by connecting some or all of phenolic hydroxyl groups in polyhydroxy compounds described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, Japanese Patent Application No. 3-33229, Japanese Patent Application No. 3-230790, Japanese Patent Application No. 3-320438, Japanese Patent Application No. 4-25157, Japanese Patent Application no. 4-52732, Japanese Patent Application No. 4-103215, Japanese Patent Application No. 4-104542, Japanese Patent Application No. 4-107885, Japanese Patent Application No. 4-107889, and Japanese Patent Application No. 4-152195 via the foregoing group —R$^0$—COO—A$^0$ or B$^0$.

Preferred among these compounds are those comprising polyhydroxy compounds described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Application No. 4-25157, Japanese Patent Application No. 4-103215, Japanese Patent Application No. 4-104542, Japanese Patent Application No. 4-107885, Japanese Patent Application No. 4-107889, and Japanese Patent Application No. 4-152195.
Specific examples of these compounds include those represented by the following general formulae [I] to [XVI]:
[I]
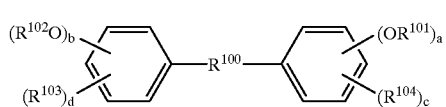
[II]
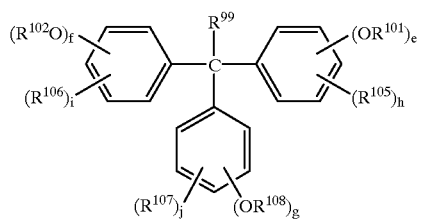
[III]
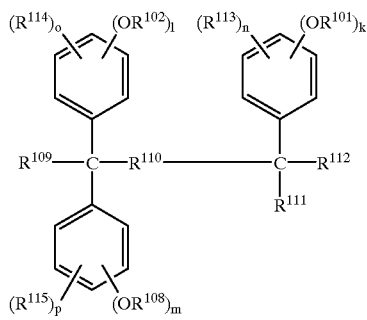
[IV]
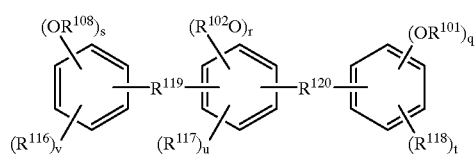
[V]
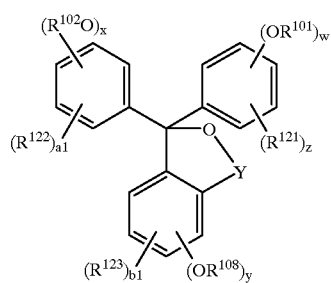
[VI]
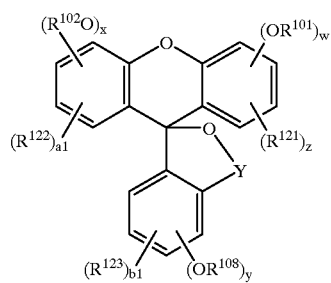
[VII]
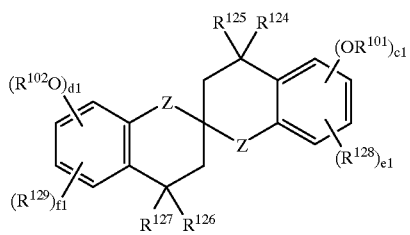
[VIII]
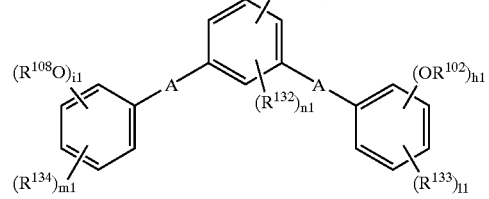
[IX]
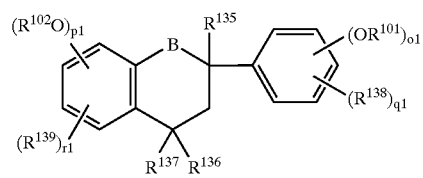
[X]
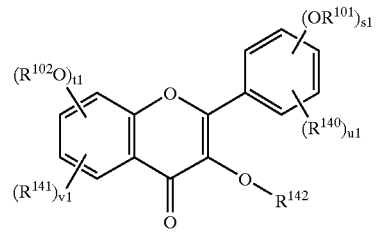
[XI]
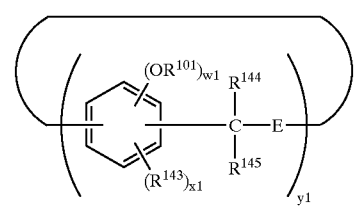

[XII]

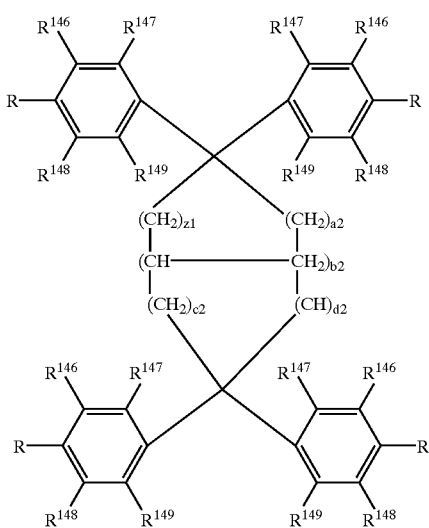

wherein $R^{101}$, $R^{102}$, $R^{108}$ and $R^{130}$ may be the same or different and each represent a hydrogen atom, —$R^0$—COO—C($R^{01}$)($R^{02}$)($R^{03}$) or —CO—O—C($R^{01}$)($R^{02}$)($R^{03}$) (in which $R^0$, $R^{01}$, $R^{02}$ and $R^{03}$ are as defined above); $R^{100}$ represents —CO—, —COO—, —NHCONH—, —NHCOO—, —O—, —S—, —SO—, —SO$_2$—, —SO$_3$— or

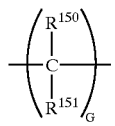

wherein G represents an integer of from 2 to 6, with the proviso that when G is 2, at least one of $R^{150}$ and $R^{151}$ is an alkyl group; $R^{150}$ and $R^{151}$ may be the same or different and each represent a hydrogen atom, alkyl group, alkoxy group, —OH, —COOH, —CN, halogen atom, —$R^{152}$—COOR$^{153}$ or —$R^{154}$—OH; $R^{152}$ and $R^{154}$ each represent an alkylene group; $R^{153}$ represents a hydrogen atom, alkyl group, aryl group or aralkyl group; $R^{99}$, $R^{103}$ to $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represent a hydrogen atom, hydroxyl group, alkyl group, alkoxy group, acyl group, acyloxy group, aryl group, aryloxy group, aralkyl group, aralkyloxy group, halogen atom, nitro group, carboxyl group, cyano group or —N($R^{155}$)($R^{156}$) (in which $R^{155}$ and $R^{156}$ each represent a hydrogen atom, alkyl group or aryl group); $R^{110}$ represents a single bond, alkylene group or

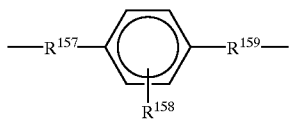

wherein $R^{157}$ and $R^{159}$ may be the same or different and each represent a single bond, alkylene group, —O—, —S—, —CO— or carboxyl group; and $R^{158}$ represents a hydrogen atom, alkyl group, alkoxy group, acyl group, acyloxy group, aryl group, nitro group, hydroxyl group, cyano group or carboxyl group, with the proviso that the hydroxyl group may be replaced by an acid-decomposable group (e.g., t-butoxycarbonylmethyl, tetrahydropyranyl, 1-ethoxy-1-ethyl, 1-t-butoxy-1-ethyl);

$R^{119}$ and $R^{120}$ may be the same or different and each represent a methylene group, lower alkyl-substituted methylene group, halomethylene group or haloalkyl group, with the proviso that the term "lower alkyl group" as used herein is meant to indicate a $C_{1-4}$ alkyl group;

$R^{124}$ to $R^{127}$ maybe the same or different and each represent a hydrogen atom or alkyl group;

$R^{135}$ to $R^{137}$ may be the same or different and each represent a hydrogen atom, alkyl group, alkoxy group, acyl group or acyloxy group;

$R^{142}$ represents a hydrogen atom, —$R^0$—COO—C($R^{01}$)($R^{02}$)($R^{03}$), —CO—O—C($R^{01}$)($R^{02}$)($R^{03}$) or

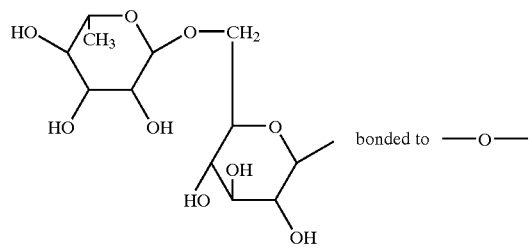

bonded to —O—

$R^{144}$ and $R^{145}$, which may be the same or different, each represents a hydrogen atom, a lower alkyl group, a lower haloalkyl group or an aryl group, $R^{146}$ to $R^{149}$ maybe the same or different and each represent a hydrogen atom, hydroxyl group, halogen atom, nitro group, cyano group, carbonyl group, alkyl group, alkoxy group, alkoxycarbonyl group, aralkyl group, aralkyloxy group, acyl group, acyloxy group, alkenyl group, alkenyloxy group, aryl group, aryloxy group or aryloxycarbonyl group, with the proviso that the four substituents having the same symbol may be the same or different;

Y represents —CO— or —SO$_2$—,

Z and B each represent a single bond or —O—;

A represents a methylene group, lower alkyl-substituted methylene group, halomethylene group or haloalkyl group, E represents a single bond or an oxymethylene group, with the proviso that when a to z, and a1 to y1 are plural, the groups in parenthesis may be the same or different;

a to q, s, t, v, g1 to i1, k1 to m1, o1, q1, s1 and u1 each represent 0 or an integer of from 1 to 5;

r, u, w, x, y, z, a1 to f1, p1, r1, t1, and v1 to x1 each represent 0 or an integer of from 1 to 4; and j1, n1, z1, a2, b2, c2, and d2 each represent 0 or an integer of from 1 to 3, with the proviso that at least one of z1, a2, c2 and d2 represents an integer of not less than 1, y1 represents an integer of 3 to 8, and all these suffixes satisfy the following relationships:

(a+b), (e+f+g), (k+l+m), (q+r+s), (w+X+y), (c1+d1), (g1+h1+i1+j1), (o1+p1) or (s1+t1)$\geq$2, (j1+n1)$\leq$3, (r+u), (w+z), (x+a1), (y+b1), (c1+e1), (d1+f1), (p1+r1), (t1+w1), (x1+w1)$\leq$4.

With respect to formula (V), (w+z), (x+a1)$\leq$5.

(a+c), (b+d), (e+h), (f+i), (g+j), (k+n), (l+o), (m+p), (q+t), (s+v), (g1+k1), (h1+l1), (i1+m1), (o1+q1), (s1+u1)$\leq$5.

[XIII]

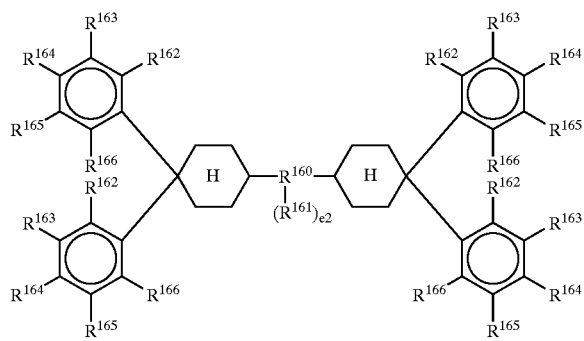

wherein $R^{160}$ represents an organic group, single bond, —S—, —SO—

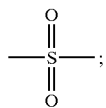

$R^{161}$ represents a hydrogen atom, monovalent organic group or

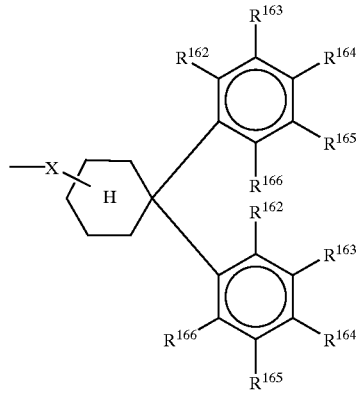

wherein $R^{162}$ to $R^{166}$ may be the same or different and each represent a hydrogen atom, hydroxyl group, halogen atom, alkyl group, alkoxy group, alkenyl group, —O—$R^0$—COO—C($R^{01}$)($R^{02}$)($R^{03}$) or —O—CO—O—C($R^{01}$)($R^{02}$)($R^{03}$), with the proviso that at least two of $R^{162}$ to $R^{166}$ each are —O—$R^0$—COO—C($R^{01}$)($R^{02}$)($R^{03}$) or —O—CO—O—C($R^{01}$)($R^{02}$)($R^{03}$) and the four or six substituents having the same symbol may be the same or different; X represents a divalent organic group; and e2 represents 0 or 1,

[XIV]

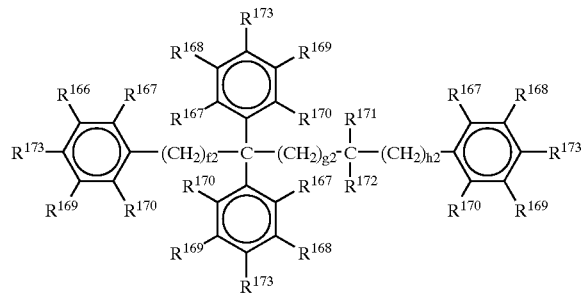

wherein $R^{167}$ to $R^{170}$ may be the same or different and each represent a hydrogen atom, hydroxyl group, halogen atom, alkyl group, alkoxy group or alkenyl group, with the proviso that the four to six substituents having the same symbol may be the same or different;

$R^{171}$ and $R^{172}$ each represent a hydrogen atom, alkyl group or

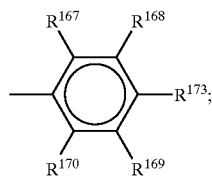

at least two of $R^{173}$'s each represent —O—$R^0$—COO—C($R^{01}$)($R^{02}$)($R^{03}$) or —O—CO—O—C($R^{01}$)($R^{02}$)($R^{03}$) group and the other each represent a hydroxyl group; f2 and h2 each represent 0 or 1; and g2 represents 0 or an integer of from 1 to 4.

[XV]

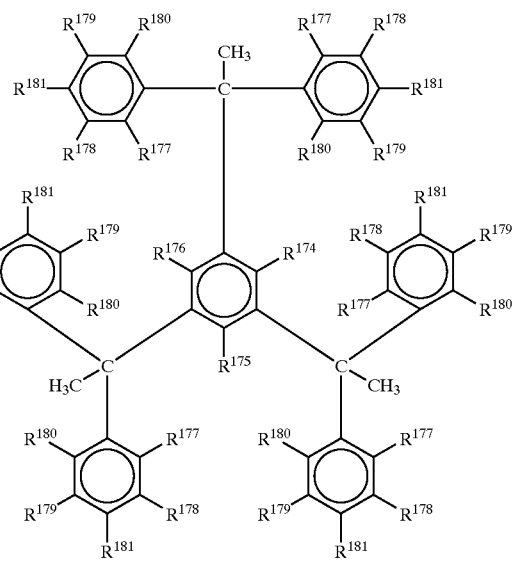

wherein $R^{174}$ to $R^{180}$ may be the same or different and each represent a hydrogen atom, hydroxyl group, halogen atom, alkyl group, alkoxy group, nitro group, alkenyl group, aryl group, aralkyl group, alkoxycarbonyl group, arylcarbonyl group, acyloxy group, acyl group, aralkyloxy group or aryloxy group, with the proviso that the six substituents having the same symbol may be the same or different; and at least two of $R^{181}$'s each represent —O—$R^0$—COO—C($R^{01}$)($R^{02}$)($RO^3$) or —O—CO—O—C($R^{01}$)($R^{02}$)($R^{03}$) group and the other each represent a hydroxyl group.

(XVI)

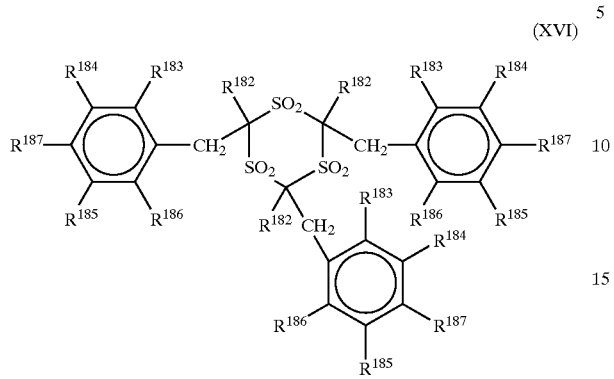

$R^{182}$'s may be the same or different and each represents a hydrogen atom or an alkyl group, $R^{183}$ to $R^{186}$ each represents a hydroxy group, a hydrogen atom, a halogen atom, an alkyl group, or an arkoxy group, and three of each of $R^{183}$ to $R^{186}$ may the same or different, and at least two of $R^{187}$ are —O—$R^0$—COO—C($R^{01}$)($R^{02}$) $R^{03}$or —O—CO—O—C($R^{01}$)($R^{02}$)($R^{03}$) and the remaining $R^{187}$ is a hydroxy group.

Specific examples of preferred compound skeletons will be given below.

(1)
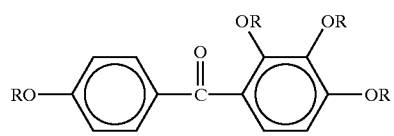

(2)
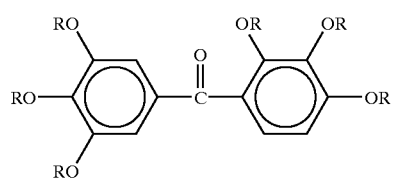

(3)
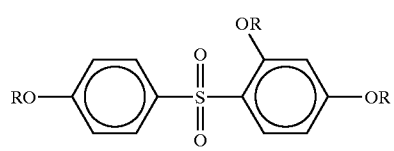

(4)
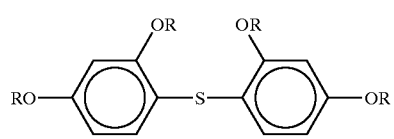

(5)
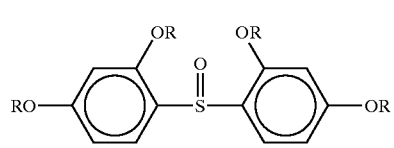

(6)
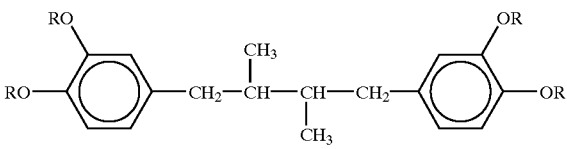

(7)
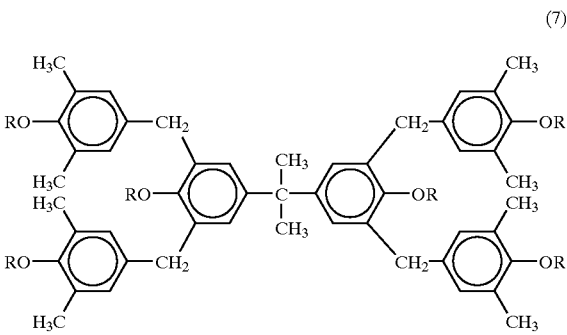

(8)
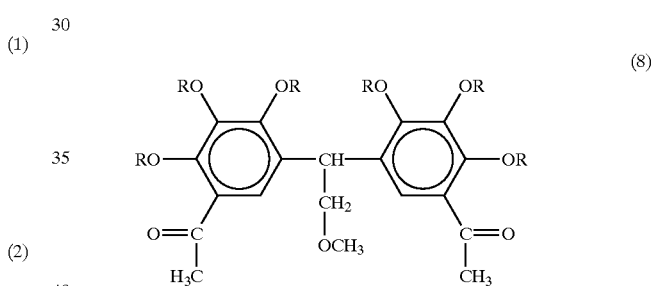

(9)
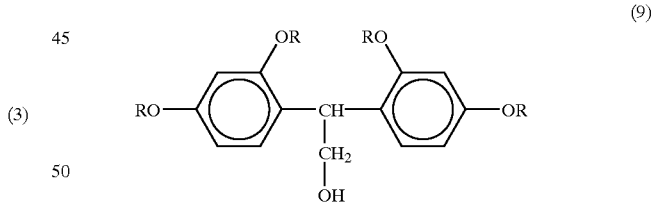

(10)
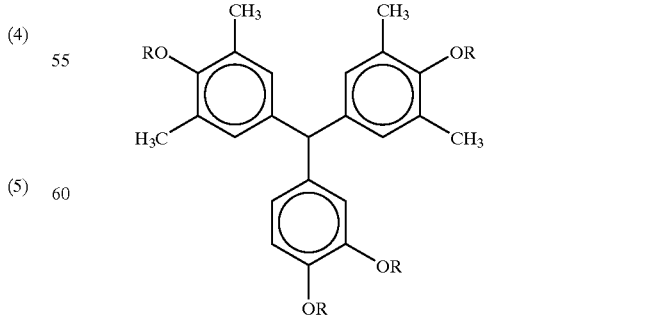

-continued
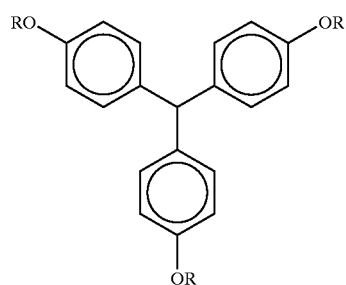
(11)
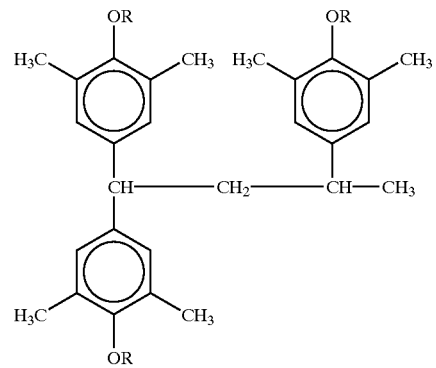
(15)
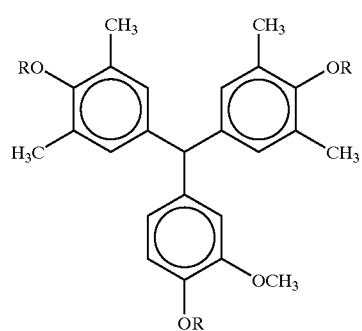
(12)
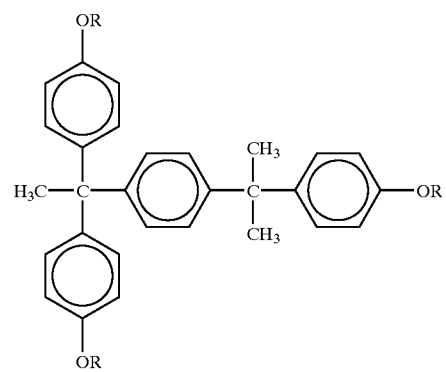
(16)
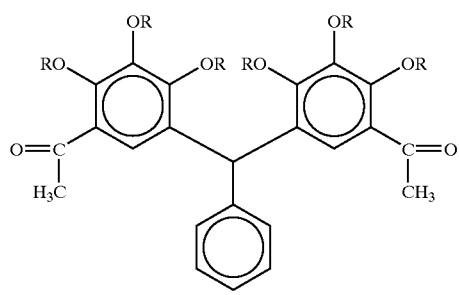
(13)
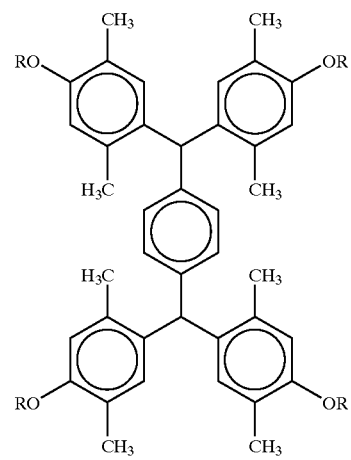
(17)
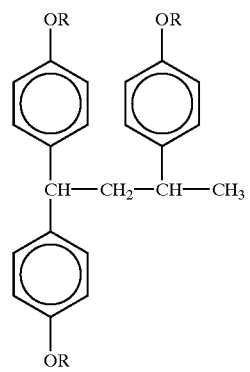
(14)
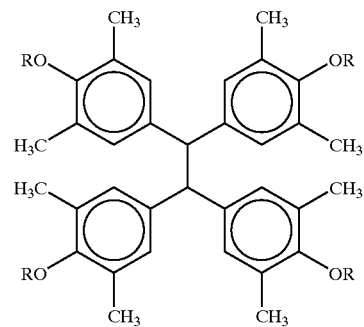
(18)

(19)
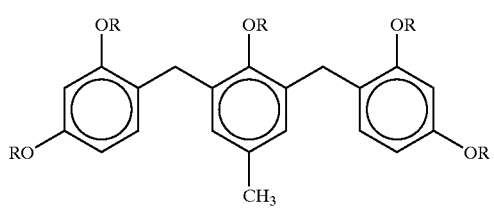
(20)
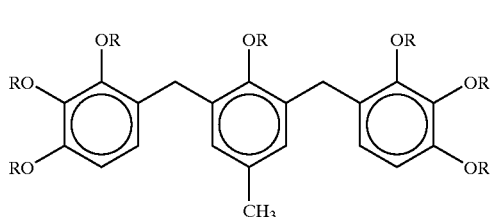
(21)
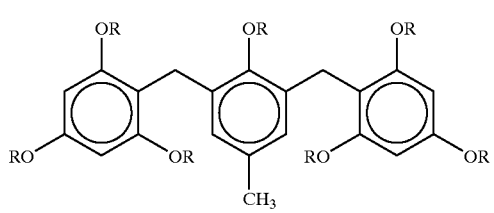
(22)
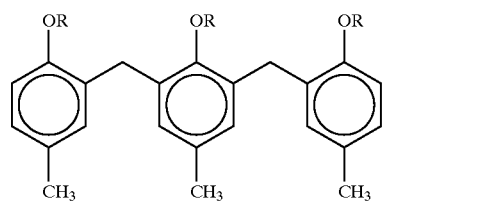
(23)
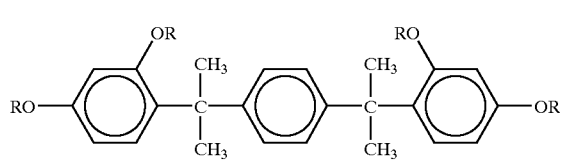
(24)
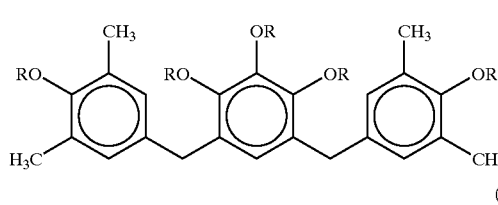
(25)
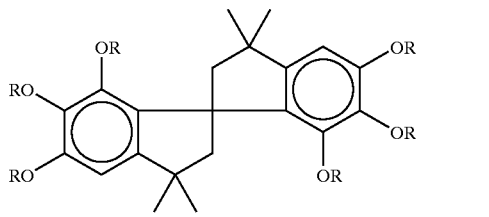
(26)
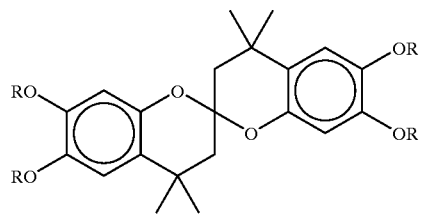
(27)
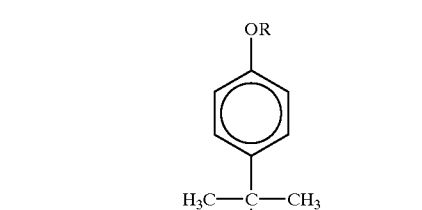
(28)
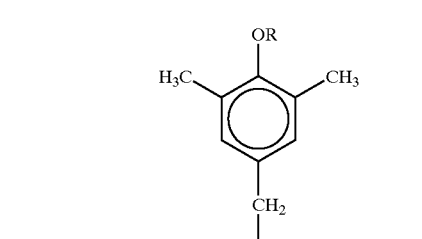
(29)
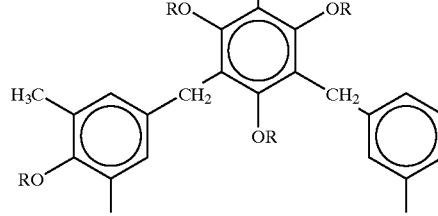

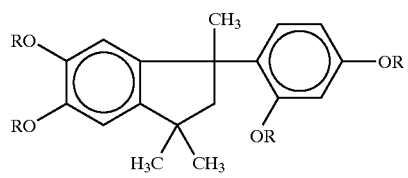
(30)
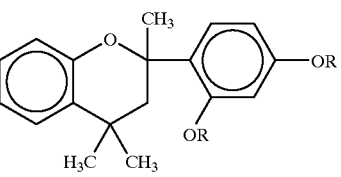
(31)
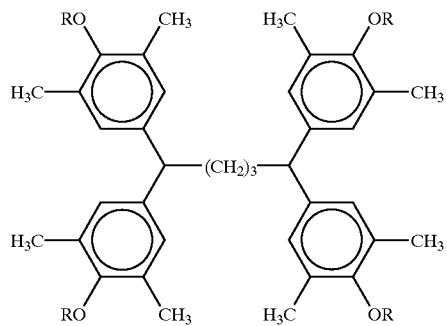
(32)
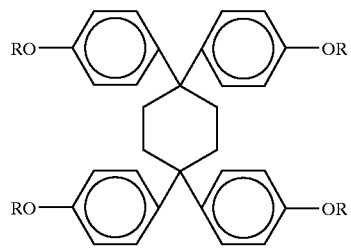
(33)
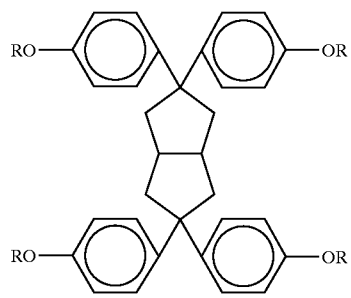
(34)
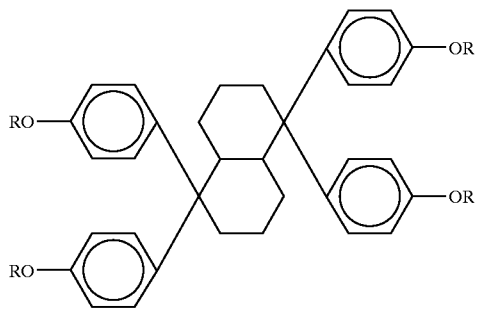
(35)
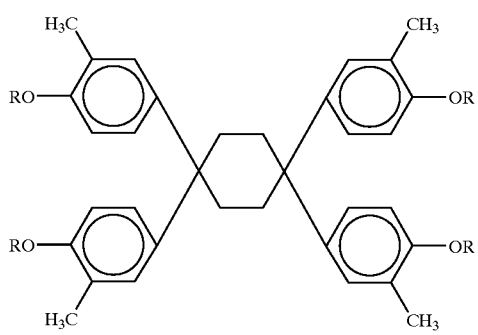
(36)
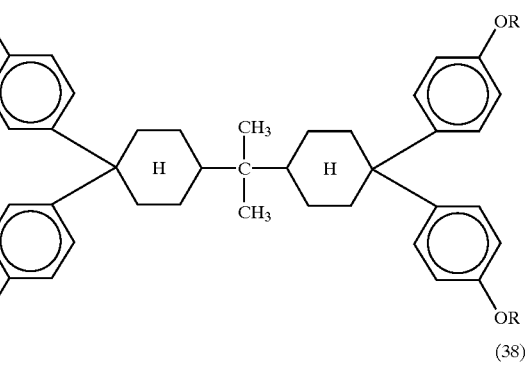
(37)
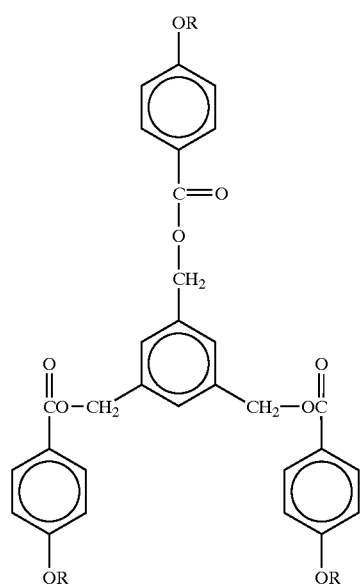
(38)

(39)
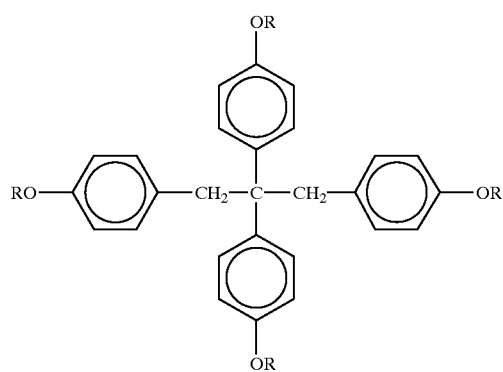

(40)
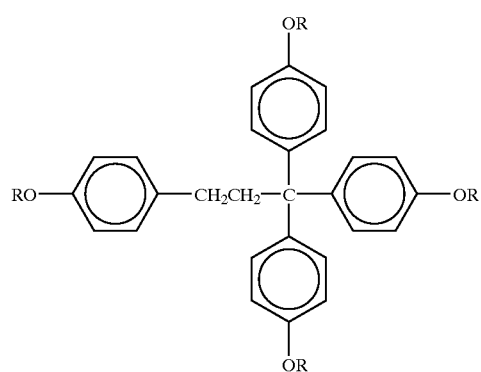

(41)
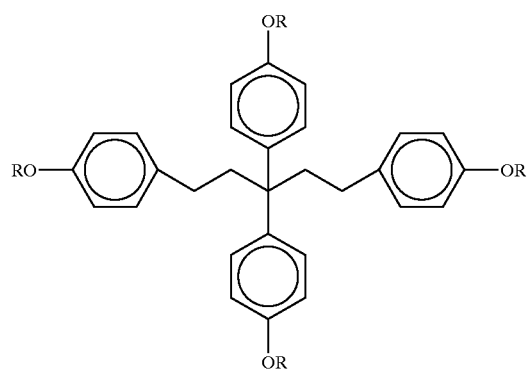

(42)
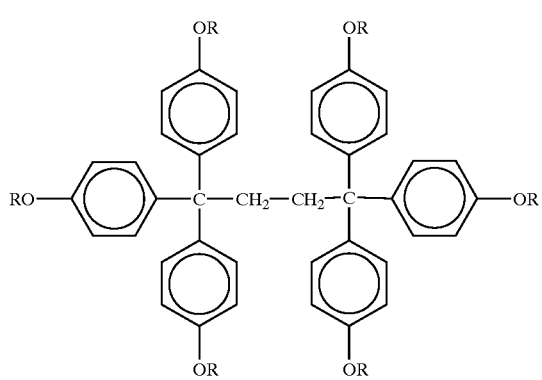

(43)
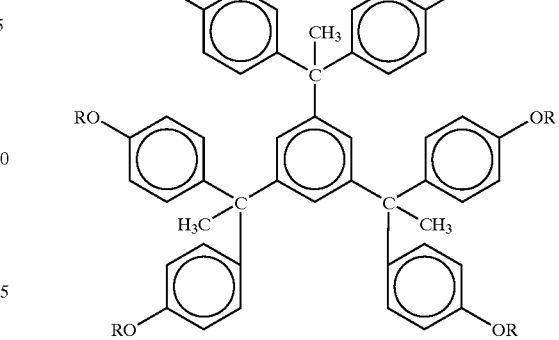

(44)
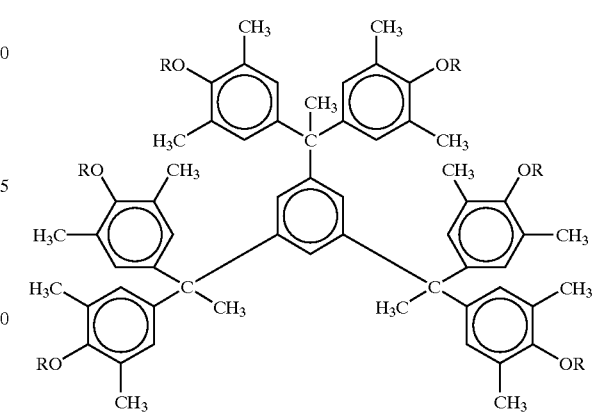

In the foregoing general formulae (1) to (44), R represents a hydrogen atom,

—CH$_2$—COO—C(CH$_3$)$_2$C$_6$H$_5$, —CH$_2$—COO—C$_4$H$_9^t$, —COO—C$_4$H$_9^t$,

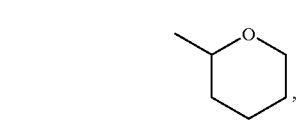

with the proviso that at least two or three, depending on the structure, of R's are groups other than hydrogen atom and the various substituents R may be the same or different.

[V] Resin (e) Insoluble in Water But Soluble in Alkaline Developer

The positive electron beam or X-ray resist composition of the present invention may comprise a water-insoluble and alkaline developer-soluble resin (hereinafter occasionally referred to as "component (e)") incorporated therein. In the case where component (e) is incorporated into the composition, the composition does not have to contain component (c), though it may contain component (c) in combination with component (e).

Examples of the component (e) include novolak resin, hydrogenated novolak resin, acetone-pyrogallol resin, o-polyhydroxystyrene, m-polyhydroxystyrene, p-polyhydroxystyrene, hydrogenated polyhydroxystyrene, halogen- or alkyl-substituted polyhydroxystyrene, hydroxystyrene-N-substituted maleimide copolymer, o/p- or m/p-hydroxystyrene copolymer, product of partial O-alkylation of hydroxyl group in polyhydroxystyrene (e.g., 5 to 30 mol % O-methylation product, O-(1-methoxy)ethylation product, O-(1-ethoxy)ethylation product, O-2-tetrahydropyranylation product, O-(t-butoxycarbonyl)methylation product), product of partial O-acylation of hydroxyl group in polyhydroxystyrene (e.g., 5 to 30 mol % O-acetylation product, O-(t-butoxy)carbonylation product), styrene-maleic anhydride copolymer, styrene-hydroxystyrene copolymer, α-methylstyrene-hydroxystyrene copolymer, carboxyl group-containing methacrylic resin, derivative thereof, and polyvinyl alcohol derivative. However, the present invention is not limited to these compounds.

Particularly preferred among these alkali-soluble resins are novolak resin, o-polyhydroxystyrene, m-polyhydroxystyrene, p-polyhydroxystyrene, copolymer thereof, alkyl-substituted polyhydroxystyrene, partial O-alkylation product of polyhydroxystyrene, partial O-acylation product of polyhydroxystyrene, styrene-hydroxystyrene copolymer, and α-methylstyrene-hydroxystyrene copolymer. The foregoing novolak resin can be obtained by allowing a specific monomer as a main component to undergo addition condensation reaction with aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, a-phenylpropionaldehyde, β-phenylpropionaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred among these is formaldehyde.

These aldehydes may be used alone or in combination of two or more thereof. Examples of the acid catalyst include hydrochloric acid, sulfuric acid, formic acid, acetic acid, and oxalic acid.

The weight-average molecular weight of the thus-obtained novolak resin is preferably from 1,000 to 30,000. If the weight-average molecular weight thereof is lower than 1,000, a considerable proportion of unexposed areas of a resist film dissolve away during development. If the weight-average molecular weight thereof exceeds 30,000, too low a developing rate results. The especially preferred range of the molecular weight of the novolak resin is from 2,000 to 20,000.

The poly(hydroxystyrene)s and derivatives and copolymers thereof shown above as alkali-soluble resins other than novolak resins each has a weight-average molecular weight of generally 2,000 or higher, preferably from 5,000 to 200,000, more preferably from 5,000 to 100,000.

Weight-average molecular weight herein means that determined by gel permeation chromatography and calculated for standard polystyrene.

In the present invention, those alkali-soluble resins (e) may be used as a mixture of two or more thereof.

Constitution examples of the resist composition according to the present invention are shown below, but the present invention is not limited thereto.

1) Positive electron beam resist composition comprising the above component (a), the above component (b), and the above component (c).
2) Positive electron beam resist composition comprising the above component (a), the above component (b), the above component (d) and the above component (e).
3) Positive electron beam resist composition comprising the above component (a), the above component (b), the above component (c) and the above component (d).

In each of the above constitution examples, the amount of component (c) in item 1), component (e) in item 2), and component (c) in item 3) in the composition is preferably from 40 to 99% by weight, more preferably from 50 to 90% by weight, each based on the solid content of the entire composition.

The amount of component (d) in the composition is preferably from 3 to 45% by weight, more preferably from 5 to 30% by weight, and still more preferably from 10 to 20% by weight, based on the solid content of the entire composition, in any of the above constitution examples.

[VI] Other Components Employable in the Present Invention

The positive electron beam or X-ray resist composition of the present invention may further comprise a dye, a pigment, a plasticizer, a surfactant, a photosensitizer, an organic basic compound, a compound containing two or more phenolic OH groups which accelerate solubility in a developer, etc. incorporated therein as necessary.

The compound containing two or more phenolic OH groups employable herein is preferably a phenol compound having a molecular weight of not more than 1,000. The phenol compound needs to contain at least two phenolic hydroxyl groups in its molecule. However, if the number of phenolic hydroxyl groups contained in the phenol compound exceeds 10, the desired effect of improving development latitude is lost. Further, if the ratio of phenolic hydroxyl group to aromatic ring falls below 0.5, the resulting dependence on the film thickness is too great and the development latitude tends to narrow. On the contrary, if this ratio exceeds 1.4, the resulting photosensitive composition exhibits a deteriorated stability, making it difficult to obtain a high resolution and a good dependence on the film thickness.

The added amount of the phenolic compound is preferably from 2 to 50% by weight, more preferably from 5 to 30% by weight based on the weight of the alkali-soluble resin (e). If the added amount of the phenolic compound exceeds 50% by weight, it increases development residue, and a new defect occurs that the pattern is deformed during development.

The synthesis of the phenol compound having a molecular weight of not more than 1,000 can be easily accomplished by those skilled in the art in accordance with the method described in JP-A-4-122938, JP-A-2-28531, U.S. Pat. No. 4,916,210, and European Patent 219,294.

Specific examples of the phenol compound will be given below, but the present invention should not be construed as being limited thereto.

Resorcin, phloroglucine, 2,3,4-trihydroxybenzophenone, 2,3,4,4'-tetrahydroxybenzophenone, 2,3,4,3',4',5'-hexahydroxybenzophenone, acetone-pyrogallol condensed resin, phloroglucoside, 2,4,2',4'-biphenyltetrol, 4,4'-thiobis(1,3-dihydroxy)benzene, 2,2',4,4'-tetrahydroxydiphenylether, 2,2',4,4'-tetrahydroxydiphenylsulfoxide, 2,2',4,4'-tetrahydroxydiphenyl sulfoxide, 2,2',4,4'-tetrahydroxydiphenylsulfone, tris(4-hydroxyphenyl)methane, 1,1-bis(4-hydroxyphenyl)cyclohexane, 4,4-(α-methylbenzylidene)bisphenol, α,α',α''-tris(4-hydroxyphenyl)-1,3,5-triisopropylbenzene, α,α',α''-tris(4-hydroxyphenyl)-1-ethyl-4-isopropylbenzene, 1,2,2-tris(hydroxyphenyl)propane, 1,1,2-tris(3,5-dimethyl-4-hydroxyphenyl)propane, 2,2,5,5-tetrakis(4-hydroxyphenyl)hexane, 1,2-tetrakis(4-hydroxyphenyl)ethane, 1,1,3-tris(hydroxyphenyl)butane, and para[α,α,α',α'-tetrakis(4-hydroxyphenyl)]-xylene.

Preferred organic basic compounds usable in the present invention are compounds which are more strongly basic than phenol. Especially preferred among these are nitrogen-containing basic compounds.

Preferred chemical environments include structures represented by the following formulae (A) to (E).

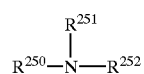

(A)

In formula (A), $R^{250}$, $R^{251}$ and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

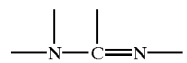

(B)

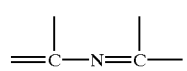

(C)

(D)

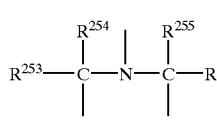

(E)

(In formula (E) $R^{253}$, $R^{254}$, $R^{255}$, and $R^{256}$ may be the same or different and each represents an alkyl group having 1 to 6 carbon atoms.)

More preferred organic basic compounds are nitrogen-containing basic compounds having, per molecule, two or more nitrogen atoms having different chemical environments. Most preferred are compounds containing both at least one substituted or unsubstituted amino group and at least one nitrogen-containing ring structure and compounds having at least one alkylamino group. Preferred examples of such compounds include substituted or unsubstituted guanidine, substituted or unsubstituted aminopyridine, substituted or unsubstituted aminoalkylpyridines, substituted or unsubstituted aminopyrrolidine, substituted or unsubstituted imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of the most preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine: 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,8-diazabicyclo[5,4,0]undec-7-ene, 1,5-diaza-bicyclo[4,3,0]non-5-ene, and 2,4,5-triphenylimidazole. Particularly preferred are 1,8-diazabicyclo[5,4,0]undec-7-ene, 1,5-diazabicyclo[4,3,0]non-5-ene, and 2,4,5-triphenylimidazole. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the aforementioned effects cannot be obtained. On the other hand, amounts thereof exceeding 10 parts by weight tend to result in reduced sensitivity and impaired development resistance of unexposed areas.

The above-described components of the composition of the present invention are dissolved in a solvent and coated on a substrate. Examples of solvents preferably used in the present invention include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methylmethoxy propionate, ethylethoxy propionate, methyl pyruvate, ethyl pyruvate, propyl pyruvate, N,N-dimethylformamide, dimethyl sulfoxide, N-methylpyrrolidone, and tetrahydrofuran. These solvents can be used alone or in combination of two or more. Propylene glycol monomethyl ether acetate is particularly preferable.

With the further advancement of the semiconductor, high performance composition has been demanded from various viewpoints such as sensitivity, coating property, the minimum requisite coating amount, the adhesion property with a substrate, heat resistance, the storage stability of composition, in addition to substantial performances such as high resolution, etc. In recent years, it is a general trend to use wafers of a large diameter in producing devices for increasing the absolute amount of the finished chips. In particular, as the resists for electron beams and X-rays are exposed under high vacuum condition in an electron beam irradiation equipment, the circumstances of adopting coating on wafers of a larger diameter come to increase from the fears of the reduction of throughput when discharge time is taken into consideration. However, coating on wafers of a larger diameter tends to the reduction of coating property, in particular, the in-plane uniformity of film thickness, therefore, the improvement of the in-plane uniformity of film thickness has been required. As a means of confirming the uniformity, a method of measuring a film thickness at a plurality of points of a wafer, taking the standard variation of each measured value, and confirming the uniformity of the thickness of the wafer by the value obtained by multiplying the standard deviation by 3, is available. The smaller the value, the higher is the in-plane uniformity. The value obtained by multiplying the standard deviation by 3 is preferably 100 or less, and more preferably 50 or less.

In addition to the above, fluorine and/or silicon surfactants can be used in the present invention, for example, fluorine surfactants and silicon surfactants such as Eftop EF301, EF303 (Shin-Akita Chemical Co., Ltd.), Florad FC430, FC431 (Sumitomo 3M Co., Limited), Megafac F171, F173, F176, F189, F08 (Dainippon Ink & Chemicals, Inc.), Surfron S-382, SC-101, SC-102, SC-103, SC-104, SC-105, SC-106 (Asahi Glass Co., Ltd.) can be exemplified. PolysiloxanepolymerKP-341 (Shin-Etsu Chemical Co., Ltd.) can also be used as a silicon surfactant.

Surfactants other than fluorine and/or silicon surfactants can be used in the present invention. Specific examples thereof include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); acrylic acid or methacrylic acid (co)polymers Polyflow No. 75, No. 95 (Kyoei-Sha Oils and Fats Chemical Industries Co., Ltd.).

The content of surfactants is generally 2% by weight or less, preferably 1% by weight or less, based on the solid content of the entire composition in the resist composition according to the present invention.

These surfactants may be used alone or in combination of two or more.

A resist composition according to the present invention can be filtered after being dissolved in a solvent. Filters which can be used for that purpose are selected from among those used in the field of a resist composition. Specifically, filters made of materials containing polyethylene, nylon or polysulfone are used. More specifically, Microguard, Microguard Plus, Microguard Minichem-D, Microguard Minichem-D PR, Millipore, Optimyzer-DEV/DEV-C, Millipore Optimyzer 16/14 (manufactured by Millipore Co., Ltd.), Ultibore N66, Posidyne, Nylon Falcon (manufactured by Paul Co. Ltd.) can be exemplified. The filter of which the pore diameter was confirmed by the following method can be used. That is, PSL standard particles (polystyrene latex beads having a particle size of 0.100 $\mu$m) are dispersed in ultra-pure water, flowed continuously to the primary side of a filter by means of a tube pump at a constant flow rate, and challenge density is measured with a particle counter. A filter which can capture 90% or more particles can be used as a filter having a pore diameter of 0.1 $\mu$m.

The above described positive electron beam or X-ray resist composition is coated by an appropriate coating means such as a spinner or a coater on a substrate commonly used in the production of precision integrated circuit elements (e.g., silicon/silicon dioxide-coated substrate), exposed through a predetermined mask, pre-baked, and developed to obtain an excellent resist.

The developing solution for the resist composition of the present invention include alkaline aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethyl ethanolamine and triethanolamine; quaternary ammonium salts such as tetramethylammonium hydroxide and tetraethylammonium hydroxide; and cyclic amines such as pyrrole and piperidine.

The above alkaline aqueous solutions can further contain appropriate amounts of alcohols and surfactants.

EXAMPLES

The present invention is explained in more detail with reference to the following examples, but the present invention should not be construed as being limited thereto.

Synthesis Example 1

Synthesis of Poly(p-hydroxystyrene/styrene) Copolymer p-tert-Butoxystyrene monomer (35.25 g) (0.2 mol) dehydrated, distilled and purified according to ordinary manner, and 5.21 g (0.05 mol) of styrene monomer were dissolved in 100 ml of tetrahydrofuran. With stirring under nitrogen gas flow, 0.033 g of azobisisobutyronitrile (AIBN) was added to the above solution three times every 2.5 hours at 80° C., and stirring was further continued for 5 hours to thereby perform polymerization reaction. The reaction solution was poured into 1,200 ml of hexane. As a result, a white resin was precipitated. The obtained resin was dried, and then dissolved in 150 ml of tetrahydrofuran.

4N hydrochloric acid was added to the above solution, and the resulting solution was refluxed with heating for 6 hours to thereby perform hydrolysis. Reprecipitation of the resin was effected in 5 liters of super-pure water, and the resulting resin was filtered, washed and dried. The resin was further dissolved in 200 ml of tetrahydrofuran, and the resulting solution was dropwise added to 5 liters of super-pure water with vigorously stirring to effect reprecipitation. This procedure of reprecipitation was repeated 3 times. The obtained resin was dried in a vacuum drier at 120° C. for 12 hours to thereby obtain poly(p-hydroxystyrene/styrene) copolymer.

Synthesis Example 2

Synthesis of Resin (c-21)

p-Acetoxystyrene (32.4 g) (0.2 mol) and 7.01 g (0.07 mol) of t-butyl methacrylate were dissolved in 120 ml of butyl acetate. With stirring under nitrogen gas flow, 0.033 g of azobisisobutyronitrile (AIBN) was added to the above solution three times every 2.5 hours at 80° C., and then stirring was further continued for 5 hours to thereby perform polymerization reaction. The reaction solution was poured into 1,200 ml of hexane, and as a result, a white resin was precipitated. The obtained resin was dried and dissolved in 200 ml of methanol.

An aqueous solution of 50 ml of water containing 7.7 g (0.19 mol) of sodium hydroxide was added to the above solution, and the resulting solution was refluxed with heating for 1 hour to thereby perform hydrolysis. Then, 200 ml of water was added to dilute the reaction product, and neutralized with hydrochloric acid to thereby obtain a white resin precipitated. The resin was filtered, washed and dried. The resin was further dissolved in 200 ml of tetrahydrofuran, and the resulting soluiton was dropwise added to 5 liters of super-pure water with vigorously stirring to effect reprecipitation. This procedure of reprecipitation was repeated 3 times. The obtained resin was dried in a vacuum drier at 120° C. for 12 hours to thereby obtain poly(p-hydroxystyrene/t-butyl methacrylate) copolymer.

Synthesis Example 3

Synthesis of Resin (c-3)

Ten grams of poly(p-hydroxystyrene) (VP-8000, manufactured by Nippon Soda Co. Ltd.) was dissolved in 50 ml of pyridine. Di-t-butyl dicarbonate (3.63 g) was dropwise added to this solution with stirring at room temperature.

After stirring for 3 hours at room temperature, the reaction solution was dropwise added to a solution of 1 liter of ion exchange water containing 20 g of concentrated hydrochloric acid. The powders precipitated were filtered, washed and dried to thereby obtain resin (c-3).

Synthesis Example 4

Synthesis of Resin (c-33)

83.1 g (0.5 mol) of p-cyclohexylphenol was dissolved in 300 ml of toluene. Subsequently, 150 g of 2-chloroethyl vinyl ether, 25 g of sodium hydroxide, 5 g of tetrabutylammonium bromide, and 60 g of triethylamine were added to the above solution and allowed to react at 120° C. for 5 hours. The reaction solution was washed with water and excess amounts of chloroethyl vinyl ether and toluene were distilled off. The obtained oil was purified by distillation under reduced pressure to thereby obtain 4-cyclohexylphenoxyethyl vinyl ether.

20 g of poly (p-hydroxystyrene) (VP-8000, manufactured by Nippon Soda Co. Ltd.) and 6.5 g of 4-cyclohexylphenoxyethyl vinyl ether were dissolved in 80 ml of THF, and 0.01 g of p-toluenesulfonic acid was added to the above solution and reaction was continued at room temperature for 18 hours. The reaction solution was dropwise added to 5 liters of distilled water with vigorously stirring. The powders precipitated were filtered, washed and dried to thereby obtain resin (c-33).

Resins (c-4), (c-28) and (c-38) were also synthesized by the same manner using each corresponding parent polymer and vinyl ether.

Synthesis Example 1 of Dissolution Inhibitive Compound

Synthesis of Compound 16

Forty-two point four (42.4) grams (0.10 mol) of 1-[α-methyl-α-(4'-hydroxyphenyl)ethyl]-4-[α',α'-bis(4"-hydroxy-phenyl)ethyl]benzene was dissolved in 300 ml of N,N-dimethyl-acetamide, and thereto were added 49.5 g (0.35 mol) of potassium carbonate and 84.8 g (0.33 mol) of cumyl bromoacetate. Then, the reaction solution was stirred at 120° C. for 7 hours. The reaction mixture was put in 2 liters of ion exchange water, neutralized with acetic acid, and extracted with ethyl acetate. The ethyl acetate extract was concentrated and purified to thereby obtain 70 g of compound 16 (R's all were —$CH_2COOC(CH_3)_2C_6H_5$ group).

Synthesis Example 2 of Dissolution Inhibitive Compound

Synthesis of Compound 41

Forty-four grams of 1,3,3,5-tetrakis(4-hydroxy-phenyl) pentane was dissolved in 250 ml of N,N-dimethylacetamide, and thereto were added 70.7 g of potassium carbonate and 90.3 g of t-butyl bromoacetate. Then, the reaction solution was stirred at 120° C. for 7 hours. The reaction mixture was put in 2 liters of ion exchange water, and the obtained viscous product was washed with water, and purified by column chromatography to thereby obtain 87 g of compound 41 (R's all were —$CH_2COOC_4H_9(t)$).

Synthesis Example 3 of Dissolution Inhibitive Compound

Synthesis of Compound 43

Twenty grams of α,α,α',α,α",α"-hexakis(4-hydroxyphenyl)-1,3,5-triethylbenzene was dissolved in 400 ml of diethyl ether. To this solution were added 42.4 g of 3,4-dihydro-2H-pyran and a catalytic amount of hydrochloric acid, and the resulting solution was refluxed for 24 hours under nitrogen atmosphere. After the reaction was terminated, a small amount of sodium hydroxide was added and the solution was filtered. The filtrate was concentrated, and purified by column chromatography, to thereby obtain 55.3 g of compound 43 (R's all were THP group).

Synthesis Example 4 of Dissolution Inhibitive Compound

Synthesis 2 of Compound 43

20 g of α,α,α',α',α",α"-hexakis(4-hydroxyphenyl)-1,3,5-triethylbenzene was dissolved in 200 ml of N,N-dimethylacetamide, and 28.2 g of potassium carbonate and 36.0 g of t-butyl bromoacetate were added to the above solution and the mixed solution was stirred at 120° C. for 7 hours. The obtained reaction product was put into 2 liters of ion exchange water and the resulted viscous product was washed with water. This compound was purified by column chromatography to thereby obtain 37 g of Compound 43-2 (R each represents —$CH_2COOC_4H_9(t)$).

Synthesis Example of Compound Represented by Formula (A)

Synthesis Example 1
Synthesis of A-22 (Benzoyloxyethyl Vinyl Ether)

Benzoic acid (244 g) (2 mol) was dissolved in 3,000 ml of toluene, and thereto were added 320 g of 2-chloroethyl vinyl ether, 88 g of sodium hydroxide, 25 g of tetrabutylammonium bromide, and 100 g of triethylamine. The resulting mixture was stirred with heating at 120° C. for 5 hours.

The reaction solution was washed with water, distilled off under reduced pressure, thereby excess amounts of 2-chloroethyl vinyl ether and toluene were removed. From the obtained oil content, 300 g of the objective benzoyloxyethyl vinyl ether was obtained by distillation under reduced pressure.

Synthesis Examples 2 to 8

Synthesis of A-23 to A-29

The above-described A-23 to A-29 were synthesized in the same manner as in the synthesis of A-22.

Example, Comparative Example (1) Coating of Resist

Components shown in Table 1 below were dissolved in 8.2 g of propylene glycol monomethyl ether acetate, and the solution was filtered through a Teflon filter having a pore diameter of 0.1 μm. Thus, a resist solution was prepared. As for the composition of Example 21, 8.2 g of ethyl lactate was used as a solvent.

Each sample solution was coated on a silicone wafer by a spin coater, and dried by a vacuum contact type hot plate at 120° C. for 90 seconds to thereby obtain a resist film having a film thickness of 0.83 μm.

(2) Formation of Resist Pattern

The resist film was subjected to irradiation using an electron beam imaging apparatus (applied voltage: 50 KeV).

(3) Evaluation of Sensitivity and Resolution

Threshold resolution at the contact hole pattern (the minimum diameter of the hole) was taken as resolution, and the minimum irradiation amount capable of resolving the threshold resolution was taken as sensitivity.

(4) Evaluation of PCD

After the resist film obtained according to the above method (1) was allowed to stand in the electron beam imaging apparatus under high vacuum for 60 minutes, a resist pattern was formed according to the method (2). The minimum contact hole size (diameter) which can be resolved by the same irradiation amount as the minimum irradiation amount obtained by the method of the above (3) (in this case, the resist film was irradiated immediately after formation without standing under high vacuum for 60 minutes after the resist film formation) is found. The closer the contact hole size and the threshold resolution obtained in (3), the better is the PCD stability.

(5) Evaluation of PED

Evaluation was performed in the same manner as in the method (2) except that the resist film was allowed to stand in the electron beam imaging apparatus under high vacuum for 60 minutes after irradiation in the formation of the resist pattern. The minimum contact hole size (diameter) which can be resolved by the same irradiation amount as the minimum irradiation amount obtained by the method of the above (3) (in this case, the resist film was heated immediately after formation without standing under high vacuum for 60 minutes after irradiation) is found. The closer the contact hole size and the threshold resolution obtained in (3), the better is the PED stability.

TABLE 1

| Example No. | Acid Generator | Binder | Cationic Polymerizable Compound | Dissolution Inhibitive Compound |
|---|---|---|---|---|
| 1 | (I-1) 0.072 g | PHS 1.19 g | (A-8) 0.18 g | (16) 0.36 g |
| 2 | (I-7) 0.072 g | (c-3) 1.55 g | (A-10) 0.18 g | — |
| 3 | (I-8) 0.072 g | (c-21) 1.19 g | (A-12) 0.18 g | (41) 0.36 g |
| 4 | (II-1) 0.072 g | (c-33) 1.55 g | (A-15) 0.18 g | — |
| 5 | (II-3) 0.072 g | (c-4) 1.19 g | (A-18) 0.18 g | (43) 0.36 g |
| 6 | (II-4) 0.072 g | (c-28) 1.55 g | (A-24) 0.18 g | — |
| 7 | (III-1) 0.072 g | (c-30) 1.19 g | (A-25) 0.18 g | (41) 0.36 g |
| 8 | (I-9) 0.072 g | (PHS) 1.19 g | (A-22) 0.18 g | (41) 0.36 g |
| 9 | (II-1) 0.072 g | (PHS/st) 1.19 g | (A-23) 0.18 g | (43) 0.36 g |
| 10 | (PAG-1) 0.072 g | (PHS) 1.19 g | (A-8) 0.18 g | (16) 0.36 g |
| 11 | (III-4) 0.072 g | (c-28) 1.19 g | (A-22) 0.18 g | (41) 0.36 g |
| 12 | (I-1) 0.072 g | (PHS) 1.19 g | p-methoxystyrene 0.18 g | (16) 0.36 g |
| 13 | (I-7) 0.072 g | (c-3) 1.55 g | spirooctane 0.18 g | — |
| 14 | (I-8) 0.072 g | (c-21) 1.19 g | *Epikote 825 0.18 g | (41) 0.36 g |
| 15 | (II-1) 0.072 g | (c-33) 1.55 g | ε-caprolactone 0.18 g | — |
| 16 | (II-3) 0.072 g | (c-4) 1.19 g | terephthalaldehyde 0.18 g | (41) 0.36 g |
| 17 | (III-1) 0.072 g | (PHS) 1.19 g | (A-22) 0.18 g | (43) 0.36 g |
| 18 | mixture of (I-9) and (II-1) 0.072 g | (PHS) 1.19 g | (A-22) 0.18 g | (43-2) 0.36 g |
| 19 | mixture of (I-9) and (II-1) 0.072 g | (PHS) 1.19 g | (A-22) 0.18 g | (41) 0.36 g |
| 20 | (III-1) 0.072 g | (PHS) 1.19 g | (A-22) 0.18 g | (43-2) 0.36 g |
| 21 | (I-9) 0.072 g | (PHS) 1.19 g | (A-22) 0.18 g | (41) 0.36 g |
| Comparison 1 | (I-1) 0.072 g | (PHS) 1.37 g | — | (16) 0.36 g |
| Comparison 2 | (PAG-1) 0.072 g | (c-3) 1.73 g | — | — |
| Comparison 3 | (II-3) 0.072 g | (c-4) 1.37 g | — | (43) 0.36 g |

*Epikote 825: Manufactured by Yuka Shell Epoxy Kabushikikaisya.

After irradiation, the resist film was heated at 110° C. for 60 seconds using a vacuum contact type hot plate, immersed in a 2.38% aqueous solution of tetramethylammonium hydroxide (TMAH) for 60 seconds, rinsed with water for 30 seconds, and dried. The shape of the cross section of the obtained contact hole pattern was observed by a scanning type electron microscope.

Acid Generator PAG-1

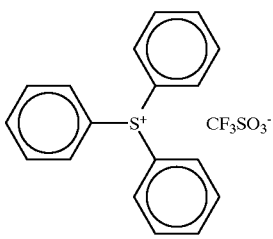

The compositions and physical properties of the binder resins used are as follows.

(c-3): p-hydroxystyrene/p-t-butoxycarboxystyrene copolymer (molar ratio: 80/20), weight average molecular weight: 13,000, molecular weight distribution (Mw/Mn): 1.4

(c-4): p-hydroxystyrene/p-(1-ethoxyethoxy)styrene copolymer (molar ratio: 70/30), weight average molecular weight: 12,000, molecular weight distribution (Mw/Mn): 1.3

(c-21): p-hydroxystyrene/t-butylmethacrylate copolymer (molar ratio: 70/30), weight averagemolecular weight: 16,000, molecular weight distribution (Mw/Mn): 2.0

(c-22): p-hydroxystyrene/p-(1-t-butoxyethoxy)styrene copolymer (molar ratio: 85/15), weight average molecular weight: 12,000, molecular weight distribution (Mw/Mn): 1.1

(c-28): p-hydroxystyrene/p-(1-phenethyloxyethoxy)styrene copolymer (molar ratio: 85/15), weight average molecular weight: 12,000, molecular weight distribution (Mw/Mn): 1.2

(c-30): p-hydroxystyrene/p-(1-phenoxyethoxyethoxy) styrene copolymer (molar ratio: 85/15), weight average molecular weight: 13,000, molecular weight distribution (Mw/Mn): 1.2

(PHS): poly-p-hydroxystyrene (VP-15000, manufactured by Nippon Soda Co. Ltd.)

(PHS/St: synthesized in Synthesis Example 1): p-hydroxystyrene/styrene copolymer (molar ratio: 80/20), weight average molecular weight: 26,000, molecular weight distribution (Mw/Mn): 1.9

TABLE 2

| Example No. | Sensitivity ($\mu C/cm^2$) | Resolution ($\mu m$) | Pattern Profile | PCD ($\mu m$) | PED ($\mu m$) |
|---|---|---|---|---|---|
| 1 | 3.5 | 0.13 | rectangular | 0.14 | 0.14 |
| 2 | 4.0 | 0.13 | rectangular | 0.13 | 0.15 |
| 3 | 4.5 | 0.13 | rectangular | 0.14 | 0.13 |
| 4 | 4.0 | 0.13 | rectangular | 0.15 | 0.15 |
| 5 | 5.0 | 0.12 | rectangular | 0.13 | 0.13 |
| 6 | 6.0 | 0.12 | rectangular | 0.14 | 0.13 |
| 7 | 5.5 | 0.13 | rectangular | 0.14 | 0.14 |
| 8 | 2.0 | 0.10 | rectangular | 0.10 | 0.10 |
| 9 | 2.5 | 0.11 | rectangular | 0.11 | 0.11 |
| 10 | 4.0 | 0.14 | rectangular | 0.15 | 0.15 |
| 11 | 3.5 | 0.11 | rectangular | 0.12 | 0.12 |
| 12 | 4.0 | 0.16 | rectangular | 0.19 | 0.19 |
| 13 | 5.5 | 0.16 | rectangular | 0.20 | 0.19 |
| 14 | 5.0 | 0.15 | rectangular | 0.18 | 0.19 |
| 15 | 6.0 | 0.14 | rectangular | 0.17 | 0.18 |
| 16 | 7.0 | 0.15 | rectangular | 0.17 | 0.17 |
| 17 | 1.8 | 0.09 | rectangular | 0.09 | 0.09 |
| 18 | 2.4 | 0.10 | rectangular | 0.10 | 0.10 |
| 19 | 2.8 | 0.11 | rectangular | 0.11 | 0.11 |
| 20 | 2.0 | 0.10 | rectangular | 0.10 | 0.io |
| 21 | 1.9 | 0.11 | rectangular | 0.11 | 0.13 |

TABLE 2-continued

| Example No. | Sensitivity ($\mu C/cm^2$) | Resolution ($\mu m$) | Pattern Profile | PCD ($\mu m$) | PED ($\mu m$) |
|---|---|---|---|---|---|
| Comparison 1 | 4.0 | 0.17 | reverse taper, capping | 0.23 | 0.22 |
| Comparison 2 | 7.0 | 0.19 | reverse taper, capping | 0.26 | 0.23 |
| Comparison 3 | 5.5 | 0.18 | reverse taper, capping | 0.28 | 0.26 |

It is apparent from the results shown in Table 2 that the positive electron beam resist composition exhibits high sensitivity, high resolution, provides rectangular pattern profile and, further, is extremely excellent in PCD stability and PED stability.

These effects are attributable to the addition of cationic polymerizable compound. Still more excellent properties can be obtained by using the compound represented by formula (I), (II) or (III) as an acid generator and the compound represented by formula (A-1).

Comparative Examples 1 to 3 to which the cationic polymerizable compound according to the present invention is not added show low resolution, provide pattern profile of a reverse taper configuration and the surface of the resist takes the configuration of a capping (a canopy top is formed on the surface of the contact hole). Further, the fluctuation of the contact hole size due to PCD and PED is extremely large, and PCD stability and PED stability are inferior.

In-plane Uniformity

Resist solutions were prepared by dissolving the components shown in Table 1 in the above-described solvent, and the compositions in Examples 1 to 21 were filtered through a polyethylene filter having a pore diameter of 0.1 $\mu m$. In-plane uniformity of each of the thus-obtained resist solutions was evaluated as follows.

Each resist solution was coated on 8-inch silicon wafer, the wafer was subjected to the same coating process of the resist layer as above, whereby a resist-coated film for measuring in-plane uniformity was obtained. The coated film thickness of this sample was measured at 36 points equally so as to generate a cross in the diameter direction of the wafer by Lambda A (a product of Dai Nippon Screen Mfg. Co., Ltd.). Standard deviation of each measured value was taken, and the value obtained by multiplying the standard deviation by 3 was less than 50 was evaluated as "A" and 50 or more as "B". As a result, in-plane uniformity of samples in which propylene glycol monomethyl ether acetate (PGMEA) was used as a resist coating solvent (Examples 1 to 20) was graded "A". On the other hand, in-plane uniformity of the sample in which ethyl lactate (EL) was used as a resist coating solvent (Example 21) was graded "B". It is understood from these facts that it is preferred to use PGMEA as a resist coating solvent in the present invention.

(6) Patterning by Actual Size X-ray Exposure

The compositions of Examples 20 and Comparative Examples 1 and 2 each was used to prepare a resist film having a thickness of 0.40 $\mu m$ in the same manner as in (1). Patterning was effected in the same manner as in (2) except for using an actual size X-ray exposure apparatus (gap value: 20 nm), and the evaluation was effected in the same manner as in (3) in terms of resist performance, i.e., sensitivity, resolution and shape of pattern. The obtained results are shown in Table 3 below.

TABLE 3

| Resist | Sensitivity (mJ/cm$^2$) | Resolution ($\mu$m) | Pattern Profile |
|---|---|---|---|
| Example 20 | 80 | 0.10 | rectangular |
| Comparative Example 1 | 190 | 0.18 | taper, reduction in film thickness |
| Comparative Example 2 | 250 | 0.17 | taper |

It can be seen from the above results that the resist compositions of the present invention exhibited a remarkably excellent performance even in an X-ray exposure.

The positive electron beam resist composition according to the present invention can provide high sensitivity, high resolution, and excellent rectangular pattern profile. Moreover, the resist composition according to the present invention is extremely excellent in PCD stability and PED stability.

While the invention has been described in detail and with reference to specific examples thereof, it will be apparent to one skilled in the art that various changes and modifications can be made therein without departing from the spirit and scope thereof.

What is claimed is:

1. A positive electron beam or X-ray resist composition which contains (a) a compound which generates an acid by the irradiation with radiation, (b) a compound having a cationic polymerizable function, and at least one of (c) a resin having a group decomposable with an acid and being capable of increasing the solubility in an alkali developing solution by the action of an acid and/or (d) a low molecular weight dissolution inhibitive compound having a molecular weight of 3,000 or less which has a group decomposable with an acid and is capable of increasing the solubility in an alkali developing solution by the action of an acid, wherein (b) the compound having a cationic polymerizable function is a compound represented by formula (A):

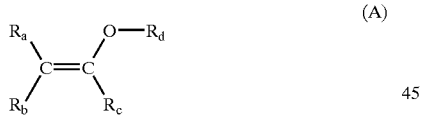

(A)

wherein $R_a$, $R_b$ and $R_c$, which may be the same or different, each represents a hydrogen atom, or an alkyl or aryl group which may have a substituent, and any two of $R_a$, $R_b$ and $R_c$ may be bonded to each other to form a saturated or olefinic unsaturated ring; and $R_d$ represents an alkyl group or an alkyl group substituted with a substituent selected from the group consisting of a hydroxyl group, an alkoxyl group, an amino group, a nitro group, a halogen atom, a cyano group, an acyl group, an acyloxy group, a sulfonyl group, a sulfonyloxy group, a sulfonylamino group, an aryl group, an aralkyl group, an imido group, a hydroxymethyl group, —O—R$_1$, —C(=O)—R$_2$, —O—C(=O)—R$_3$, —C(=O)—O—R$_4$, —S—R$_5$, —C(=S)—R$_6$, —O—C(=S)—R$_7$, and —C(=S)—O—R$_8$, where R$_1$ represents a straight chain, branched or cyclic alkyl group, an acyl group, a sulfonyl group, a sulfonyloxy group, a sulfonylamino group, an imido group, an aryl group which may have a substituent selected from the group consisting of a straight chain, branched or cyclic alkyl group, an alkoxy group, an amino group, a nitro group, a halogen atom, a cyano group, an acyl group, an aryl group and an aralkyl group, an aralkyl group which may have a substituent selected from the group consisting of a straight chain, branched or cyclic alkyl group, an alkoxy group, an amino group, a nitro group, a halogen atom, a cyano group, an acyl group, an aryl group and an aralkyl group, or —(CH$_2$CH$_2$—O)$_n$—R$_9$, wherein n represents an integer of from 1 to 20 and R$_9$ represents a hydrogen atom or an alkyl group; R$_2$ represents a straight chain, branched or cyclic alkyl group, an alkoxyl group, an amino group, an aryl group which may have a substituent selected from the group consisting of a straight chain, branched or a cyclic alkyl group, an alkoxy group, an amino group, a nitro group, a halogen atom, a cyano group, an acyl group, an aryl group and an aralkyl group, an aralkyl group which may have a substituent selected from the group consisting of a straight chain, branched or a cyclic alkyl group, an alkoxy group, an amino group, a nitro group, a halogen atom, a cyano group, an acyl group, an aryl group and an aralkyl group, or —(CH$_2$CH$_2$—O)$_n$—R$_9$, wherein n represents an integer of from 1 to 20 and R$_9$ represents a hydrogen atom or an alkyl group; and R$_3$ to R$_8$ each represent a straight chain, branched or cyclic alkyl group, an aryl group which may have a substituent selected from the group consisting of a straight chain, branched or a cyclic alkyl group, an alkoxy group, an amino group, a nitro group, a halogen atom, a cyano group, an acyl group, an aryl group and an aralkyl group, an aralkyl group which may have a substituent selected from the group consisting of a straight chain, branched or a cyclic alkyl group, an alkoxy group, an amino group, a nitro group, a halogen atom, a cyano group, an acyl group, an aryl group and an aralkyl group, or —(CH$_2$CH$_2$—O)$_n$—R$_9$, wherein n represents an integer of from 1 to 20 and R$_9$ represents a hydrogen atom or an alkyl group; and wherein the compound represented by formula (A) only contains one

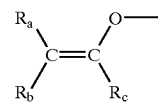

group in the molecule.

2. The positive electron beam or X-ray resist composition as claimed in claim 1, wherein (b) the compound having a cationic polymerizable function is at least a compound selected from the group consisting of a vinyl compound, a cycloalkane compound, a cyclic ether compound, a lactone compound and an aldehyde compound.

3. The positive electron beam or X-ray resist composition as claimed in claim 2, wherein said compound having a cationic polymerizable function (b) is a vinyl compound.

4. The positive electron beam or X-ray resist composition as claimed in claim 2, wherein said compound having a cationic polymerizable function (b) is a cyclic ether compound.

5. The positive electron beam or X-ray resist composition as claimed in claim 2, wherein said compound having a cationic polymerizable function (b) is a lactone compound.

6. The positive electron beam or X-ray resist composition as claimed in claim 2, wherein said compound having a cationic polymerizable function (b) is an aldehyde compound.

7. The positive electron beam or X-ray resist composition as claimed in claim 1, wherein (a) the compound which generates an acid by the irradiation with radiation contains at least one compound represented by the following formula (I), (II) or (III):

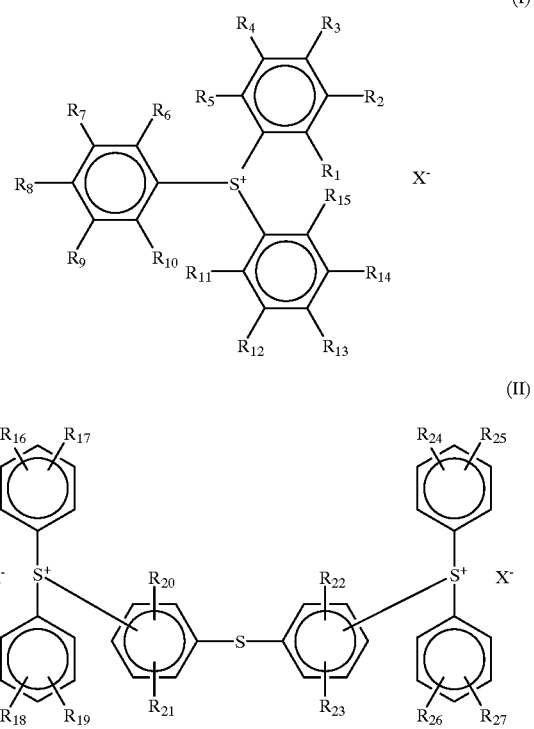

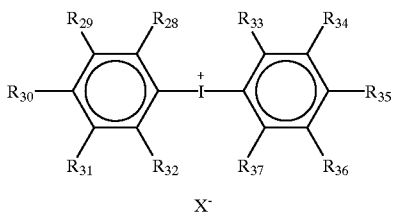

wherein $R_1$ to $R_{37}$, which may be the same or different, each represents a hydrogen atom, a straight chain, branched, or cyclic alkyl group, a straight chain, branched, or cyclic alkoxyl group, a hydroxyl group, a halogen atom, or an —S—$R_{39}$ group; $R_{38}$ represents a straight chain, branched, or cyclic alkyl group or aryl group, and two or more of $R_1$ to $R_{15}$, $R_{16}$ to $R_{27}$, and $R^{28}$ to $R_{37}$ may be bonded to form a ring containing a single bond or one or two or more atom(s) selected from a carbon atom, an oxygen atom, a sulfur atom and a nitrogen atom; $X^-$ represents an anion of benzenesulfonic acid, naphthalenesulfonic acid or anthracenesulfonic acid having at least one group selected from the group consisting of at least one fluorine atom, a straight chain, branched, or cyclic alkyl group substituted with at least one fluorine atom, a straight chain, branched, or cyclic alkoxyl group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom, and an alkoxycarbonyl group substituted with at least one fluorine atom.

8. The positive electron beam or X-ray resist composition as claimed in claim 7, wherein the resist composition is a positive electron beam resist composition.

9. The positive electron beam or X-ray resist composition as claimed in claim 1, which contains at least one resin (c).

10. The positive electron beam or X-ray resist composition as claimed in claim 1, which contains at least one low molecular weight dissolution inhibitive compound (d).

11. The positive electron beam or X-ray resist composition as claimed in claim 1, wherein said compound having a cationic polymerizable function (b) is at least one compound selected from the group consisting of

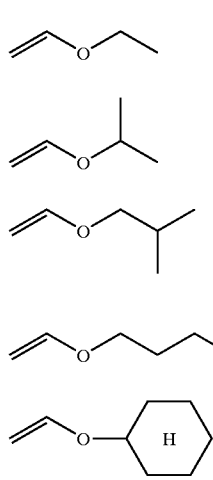

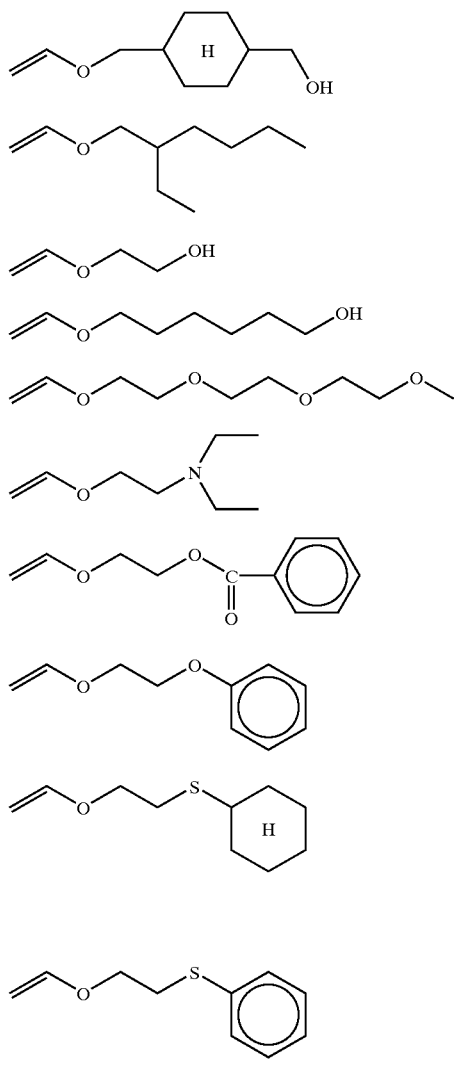

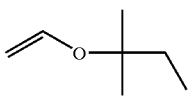
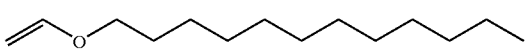
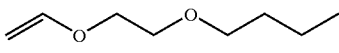
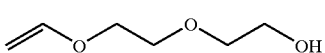
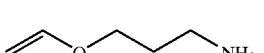
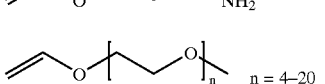
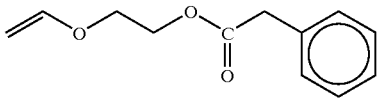
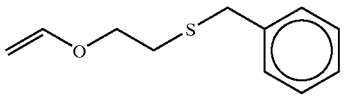
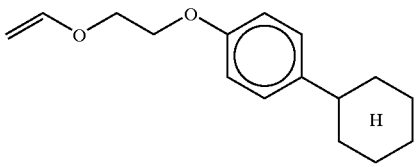
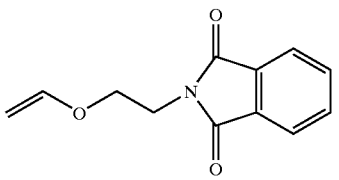

and

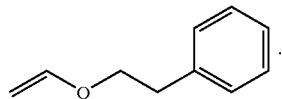

12. A positive electron beam or X-ray resist composition which contains (a) a compound which generates an acid by the irradiation with radiation, (b) a cycloalkane compound having a cationic polymerizable function, and at least one of (c) a resin having a group decomposable with an acid and being capable of increasing the solubility in an alkali developing solution by the action of an acid and/or (d) a low molecular weight dissolution inhibitive compound having a molecular weight of 3,000 or less which has a group decomposable with an acid and is capable of increasing the solubility in an alkali developing solution by the action of an acid.

* * * * *